(12) United States Patent
Tokita et al.

(10) Patent No.: US 8,993,513 B2
(45) Date of Patent: Mar. 31, 2015

(54) MOLECULAR DEVICE, SINGLE-MOLECULAR OPTICAL SWITCHING DEVICE, FUNCTIONAL DEVICE, MOLECULAR WIRE, AND ELECTRONIC APPARATUS USING FUNCTIONAL DEVICE

(75) Inventors: Yuichi Tokita, Kanagawa (JP); Jusuke Shimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 1282 days.

(21) Appl. No.: 12/146,244

(22) Filed: Jun. 25, 2008

(65) Prior Publication Data
US 2009/0090905 A1    Apr. 9, 2009

(30) Foreign Application Priority Data

Jul. 13, 2007   (JP) ................................. 2007-184477

(51) Int. Cl.
| | |
|---|---|
| C07K 14/00 | (2006.01) |
| H01L 51/00 | (2006.01) |
| B82Y 10/00 | (2011.01) |
| H01L 29/76 | (2006.01) |
| H01L 51/05 | (2006.01) |
| H01L 51/42 | (2006.01) |
| H01L 27/30 | (2006.01) |

(52) U.S. Cl.
CPC ............. *H01L 51/0093* (2013.01); *B82Y 10/00* (2013.01); *H01L 29/7613* (2013.01); *H01L 51/0595* (2013.01); *H01L 51/42* (2013.01); *H01L 27/307* (2013.01); *Y02E 10/549* (2013.01)
USPC ................................................ 514/2; 257/40

(58) Field of Classification Search
None
See application file for complete search history.

(56) References Cited

FOREIGN PATENT DOCUMENTS

| | | |
|---|---|---|
| JP | 61-163663 | 7/1986 |
| JP | 62-000844 | 1/1987 |
| JP | 62-043068 | 2/1987 |
| JP | 63-019855 | 1/1988 |
| JP | 06-302805 | 10/1994 |
| JP | 11-266007 | 3/1998 |

OTHER PUBLICATIONS

Magner and McLendon, "Ground-State and Excited-State electron transfer reactions of Zinc Cytochrome c", J. Phys. Chem. 93:7130-7134 (1989).*
Braun et al., "Electrostatic Complexation and Photoinduced Electron Transfer between Zn-Cytochrome c and Polyanionic Fullerene Dendrimers", Chem. Eur. J. 9: 3867-3875 (2003).*
J. H. Schon, Ch. Kolc, B. Batlogg, Nature, 406, 702 (2000).
V. Balzani, A Credi, andM. Venturi, Coord. Chem.Rev., 171, 3 (1998).
T. M. Rice, S. Gopalan and m.Sigrist, Europhys. Lett., 23,4 45 (1993).
M. Uehara, T. Nagata, J.Akimitsu, H. Takahashi, H. Mori and K. Kinoshita, J. Phys. Soc. Jpn., 65, 2764 (1996).
N. Kimizuka, N. Oda, T.Kunitake, Inorg. Chem. 39, 2684 (2000).
H. Imai, T. Inabe, T. Otsuka, T. Okuno, andK. Agawa,Phys. R ev. B 54, R6838 (1996).
James R. Health, Philip J. Kuekes, Gregory S.Snider,R. Stanley Williams, Science vol. 280 (1998).
W. Huang,S. Gou, D.Hu, S.Chantrapromma, H.Fun and Q. meng, Inorg. Chem., 40 1712 (2001).
Emmanuel Topoglidis,Colin J. Campbell, Emilio Palomares, and James R. Durrant, chem. Commun. 2002, 1518-1519.
Jeong-Woo Choi and masamichi Fujihira, Appl. Phys. Lett 8 4, 2187-2189 (2004).
Shiro Yasutomi,Tomoyuki Morita, yukio Imanishi, Shunsaku Kimura, Science 304, 1944-1947 (2004).
Ryutaro Tanimura, Michael G. Hill,Emanuel Margoliash, Katsumi Niki, Hiroyuki Ohno, and Harry Gray, Electrochem. Solid-State Lett. 5, E67-E70 (2002).
Manas et al., "The Influence of Protein Environment on the Low Temperature Electronic Spectroscopy of Zn-Substituted Cytochrome c", The Journal of Physical Chemistry B, American Chemical Society, vol. 104, p. 6932-6941, 2000. (10 pages).
Astuti et al., "Triplet State Photosensitization of Nanocrystalline Metal Oxide Electrodes by Zinc-Substituted Cytochrome c: Application to Hydrogen Evolution," Journal of the American Chemical Society, American Chemical Society, vol. 127, p. 15120-15126, Published online Oct. 8, 2005. (7 pages).
Guo et al., "Photophysical Probes of a Protein/Semiconductor Electrode Interface," Journal of the American Chemical Society, American Chemical Society, vol. 117, p. 546-547, 1995. (2 pages).
Magner et al., "Ground-State and Excited-State Electron-Transfer Reactions of Zinc Cytochrome c," The Journal of Physical Chemistry, American Chemical Society, vol. 93, p. 7130-7134, 1989. (5 pages).
Notice of reasons for refusal issued in connection with Japanese Patent Application No. 2013-203287, dated Aug. 12, 2014. (7 pages).
E. Topoglidis, et al., "Photoelectrochemical study of Zn cytochrome-c immobilised on a nanoporous metal oxide electrode," The Royal Society of Chemistry,Chem. Commun., 2002, pp. 1518-1519. (2 pages).

\* cited by examiner

*Primary Examiner* — Anand Desai
(74) *Attorney, Agent, or Firm* — K&L Gates LLP

(57) ABSTRACT

A molecular device including: at least one molecule of zinc cytochrome c; in which an electron or a hole is transferred within the at least one molecule of zinc cytochrome c bar utilizing transition of an electron between molecular orbitals of the at least one molecule of zinc cytochrome c. The molecular orbitals, for example, are a first molecular orbital localized in a first amino acid residue of the at least one molecule of zinc cytochrome c, and a second molecular orbital which is localized in a second amino acid residue of the at least one molecule of zinc cytochrome c and which has a maximum transition probability per unit time with respect to the first molecular orbital. In this case, the electron or the hole is transferred between the first amino acid residue and the second amino acid residue.

13 Claims, 33 Drawing Sheets

FIG.23
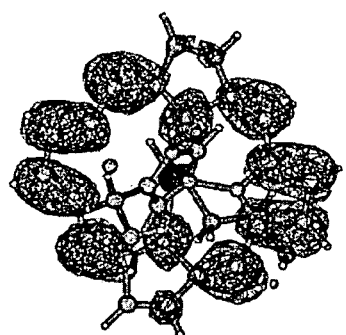
147
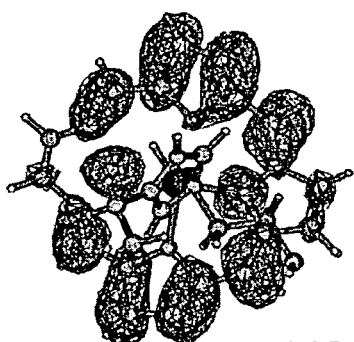
148
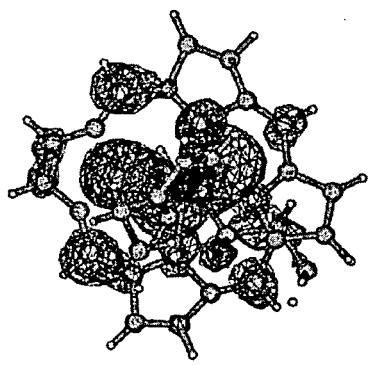
144
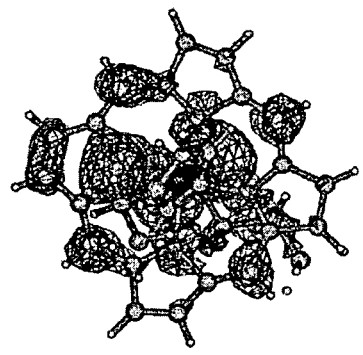
145
FIG.24
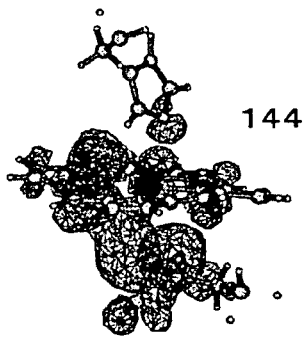
144
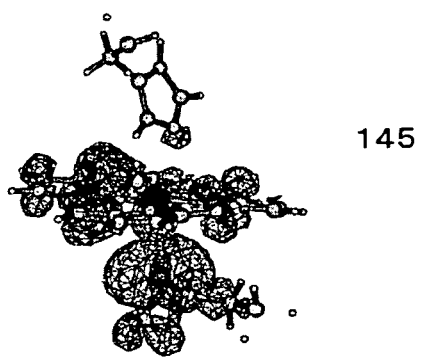
145

FIG.26
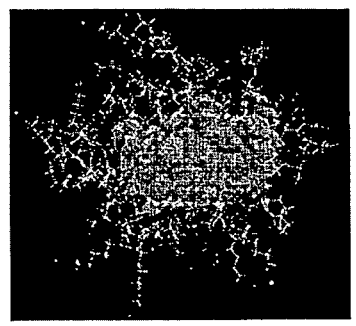
3299
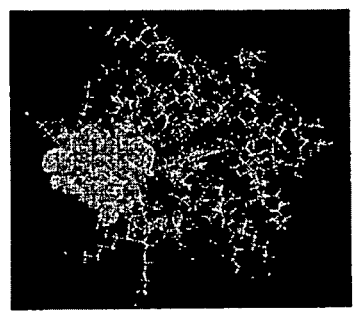
3298
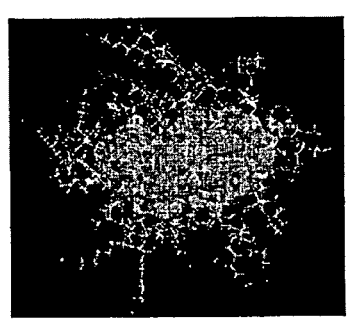
3297
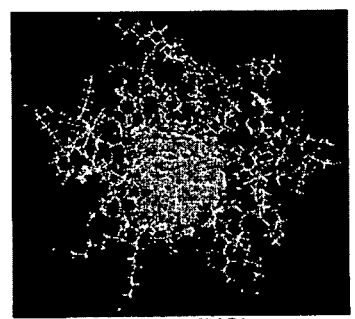
3296(LUMO)
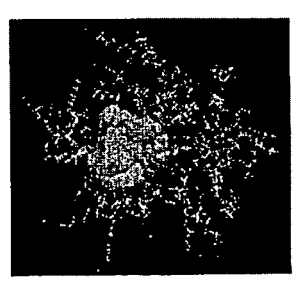
3295(HOMO)
3294
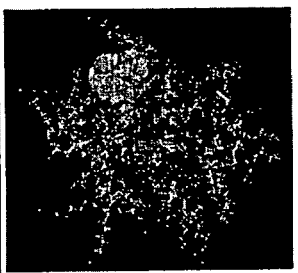
3293
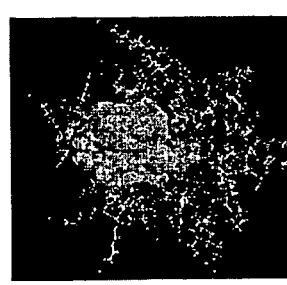
3292
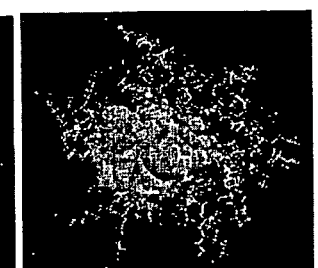
3291
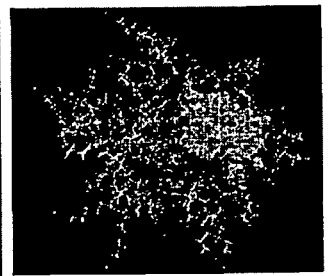
3290

FIG.27
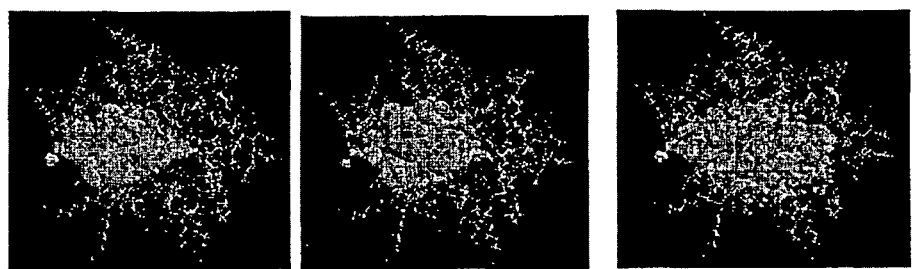
3289　　　3288　　　3287
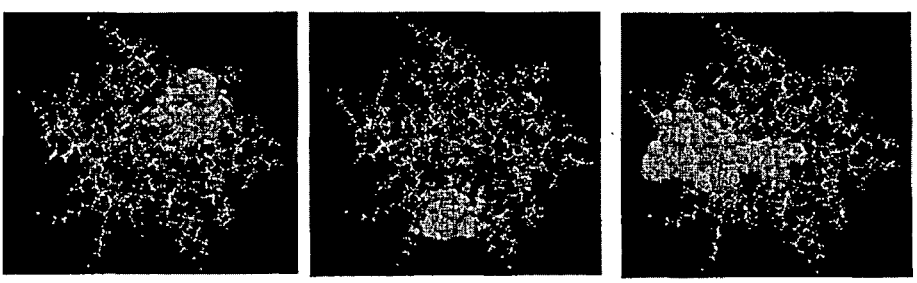
3286　　　3285　　　3284
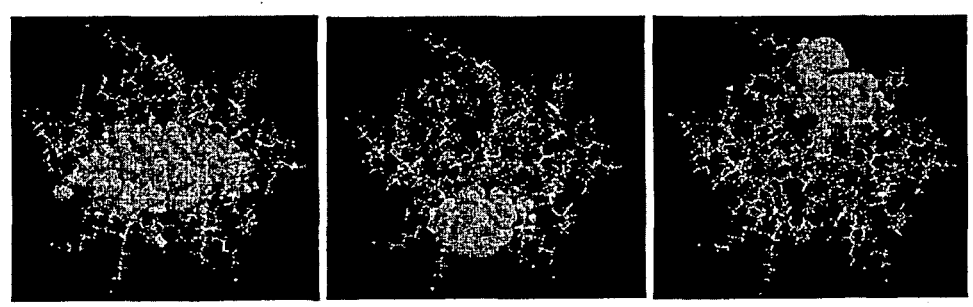
3283　　　3282　　　3281
3280　　　3279　　　3278

FIG.28
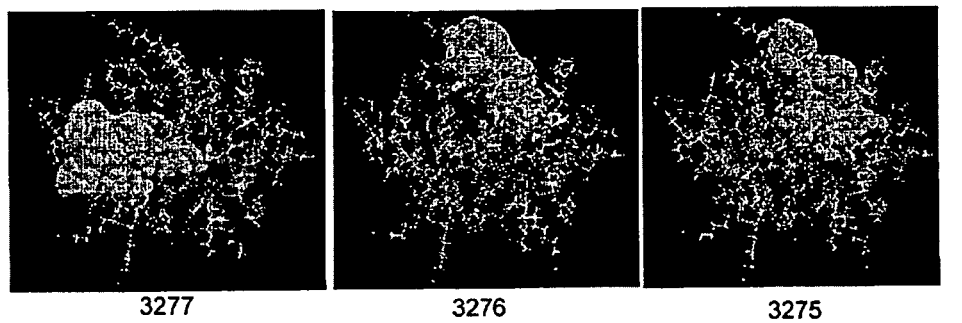
3277　　　3276　　　3275
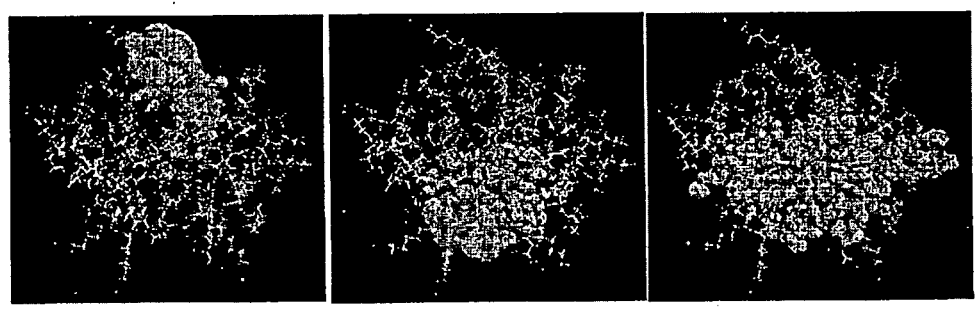
3274　　　3273　　　3272
3271　　　3270　　　3269
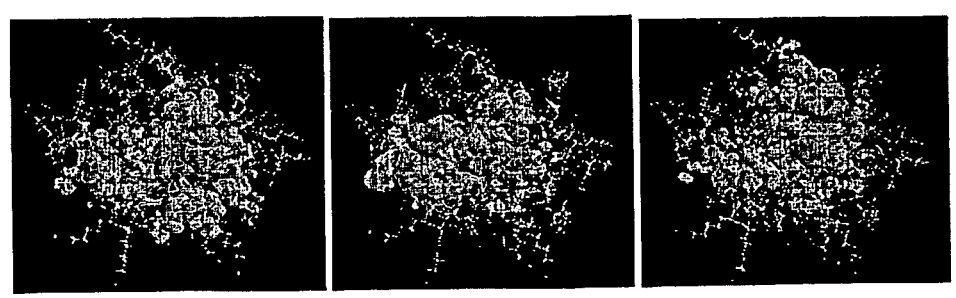
3268　　　3267　　　3266

MOLECULAR DEVICE, SINGLE-MOLECULAR OPTICAL SWITCHING DEVICE, FUNCTIONAL DEVICE, MOLECULAR WIRE, AND ELECTRONIC APPARATUS USING FUNCTIONAL DEVICE

CROSS REFERENCES TO RELATED APPLICATIONS

The present application claims priority to Japanese Patent Application JP 2007-184477 filed in the Japan Patent Office on Jul. 13, 2007, the entire contents of which being incorporated herein by reference.

BACKGROUND

The present application relates to a molecular device, a single-molecular optical switching device, a functional device, a molecular wire, and an electronic apparatus. In particular, the present application relates to a molecular device, a single-molecular optical switching device, and a functional device each of which uses an electron transfer protein such as zinc cytochrome c, a molecular wire which is suitable for being used in a wiring in various devices, and an electronic apparatus using the functional device.

In the world of the electronics devices each using the semiconductor in an information communication field, a computer field, and the like, the miniaturization technology has been developed for the purpose of enhancing the performance of the electronics devices. However, the physical limit of the miniaturization technology, has been almost here, and thus the breakthroughs by a new engineering innovation are desired. An electronic circuit using molecules, and a molecular device technology can be given as one of the breakthroughs. The molecular device functions on the order of angstroms in size, and thus the integration level of the molecular device can be improved $10^3$ to $10^6$ times as high as that of the semiconductor device. This, for example, is described in a non-patent literary document of "Molecular Nano-Technology: Developing of Ability of Molecule into Device Development", by Kazumi Matsusige and Kazuyuki Tanaka, KAGAKU-DOJIN PUBLISHING CO., LTD.

With regard to the principles of driving the molecular device, and the model thereof, several proposals have been made.

Batlogg et al. obtained a knowledge that the characteristics of the conductivity or the superconductivity develop in a crystal of an organic matter, or the like by using the technology of the field effect transistor (FET). This knowledge is described in a non-patent literary document of J. H. Schon, Ch. Kolc, B. Batlogg: Nature, 406, 702(2000). The characteristics are found out in a fullerene and a metallic complex as well, and thus attract attention now because they can be expected to give each of the various compound molecules a switching function through the carrier doping by an electric field.

In addition, Wada et al. proposed a model of a molecular single-electron transistor including the fullerene in the form of a quantum dot as the possibility of the single-molecular device. This technique is described in Japanese Patent Laid-Open No. Hei 11-266007. This technique is such that an electrode is joined in the form of a tunnel junction to the quantum dot, and a gate voltage is applied to the electrode through an insulating layer to change a potential of the quantum dot, thereby developing a function as a transistor.

Moreover, there is also an attempt to use a supermolucule showing various structural and functional properties, and to apply a molecule recognizing function thereof to switching. The supermolucule is such that a plurality Of molecules are organized by utilizing a noncovalent bond-like interaction such as coordinate bond, hydrogen bond or an intermolecular force, thereby acquiring the various structural and functional properties each of which may be impossible in a state of a single molecule. Balzani et al. proposes a molecular switch which a behavior changes due to an external field such as pH or a light by utilizing a supermolecular compound, such as catenane or rotaxane, having a molecular recognizing function. This technique, for example, is described in a non-patent literary document of V. Balzani, A. Credi, and M. Venturi: Coord. Chem. Rev., 171, 3 (1998).

On the other hand, with regard to a wiring technique in the molecular device, there is an attempt to introduce a functional group such as thiol to a terminal of a conductive polymer molecule to perform wiring connection by utilizing chemical adsorption of the conductive polymer molecule for a gold or ITO electrode.

Although many researches about the molecular device have been made so far, as has already been described, the technique with which the practical molecular device or the circuit using the same can be configured is not yet provided as the case now stands.

In the design or configuration of the molecular device or the circuit using the same, it becomes a problem how the disposition and arrangement of the individual molecules, the recognition of the individual molecules, the access to the individual molecules, the wiring for formation of a circuit by minutely connecting specific molecular devices to one another, the addressing and the like are carried out. For example, although the technology for disposing atoms on a one-by-one basis by using a scanning probe microscope (SPM), or the like has been developed for the disposition and arrangement of the individual molecules described above, such a technique is not realistic in terms of the design or configuration of the device on the order of nanometers in scale. In addition, with regard to the wiring described above, it is thought that when the molecular device described above is designed, it is realistic to drive the molecular device by using an electrical signal in the solid similarly to the case of the semiconductor device. However, it is very difficult to connect a macro-scale conducting wire to the molecular level device.

On the other hand, it is thought that in the design or configuration of the molecular device or the circuit using the same, a molecular wire which is formed in the form of a single chain polymer or one-dimensionally integrated molecules is an important factor in a conductive path or the molecular device having a switching function by itself. For a viewpoint of this, the molecular wire has been studied. However, in the case of the molecular wire which is currently studied, a conduction mechanism thereof is not sufficiently resolved as the case now stands. In addition, there is a problem that it is not easy to form the molecular wire because in general, the conductivity of the simple one-dimensional material is impaired due to the property, such as the Peierls transition, peculiar to the one-dimensional system.

In addition, with regard to a metallic complex chain expected as the molecular wire, especially, a ladder type metallic complex, a theoretical study about the property thereof is started by Rice et al. In the case of the ladder type structure called a spin ladder having an even number of antiferromagnetic metallic chains arranged therein, it is anticipated that the metallic complex having the ladder type structure shows the superconductivity through the carrier doping. Thus, there is also conceivable the possibility that the metallic complex having the ladder type structure functions as a device. This, for example, is described in a non-patent literal) document of T. M. Rice, S. Gopalan and M. Sigrist: Europhys. Lett., 23, 445 (1993). As an experimental example, double-stranded ladder type compounds each having a copper oxide used therein are synthesized, and it is found out that the resulting compound shows a superconductivity phenomenon under a high pressure. This, for example, is described in a non-patent literary document of M. Uehara, T. Nagata, J. Akimitsu, H. Takahasi, H. Mori and K. Kinoshita: J. Phys. Soc. Jpn., 65, 2764 (1996). In addition, the formation of the molecular wire by dispersing a halogen bridge metallic complex covered with an organic paired anion into a solvent is studied by Kimizuka et al. This study results are disclosed in a non-patent literary document of N. Kimizuka, N. Oda, T. Kunitake: Inorg. Chem. 39, 2684 (2000). Moreover, a ladder type compound using a metallic complex ba p-EPYNN and Ni (dmit)$_2$ is also studied. This study results, for example, are disclosed in a non-patent literary document of H. Imai, T. Inaba, T. Otsuka, T. Okuno, and K. Agawa: Phys. Rev. B54, R6838 (1996). Furthermore, a so-called crossbar switch for controlling switching at an intersection point at which nanowires are made to run at right angles with each other in accordance with an input from the nanowire is thought to be a candidate of the nanodevice not requiring any of the complicated processes. In recent years, the crossbar switch has been actively studied. This study results, for example, are disclosed in a non-patent literacy document of James R. Heath, Philip J. Kuekes, Gregory S. Snider, R. Stanley Williams: Science Vol. 280 (1998). If an array using the nanowire described above can be structured at the molecular level and from bottom up, it is expected from a viewpoint that a very dense device can be realized with relative ease.

However, both the molecular wire and the nanowire described above merely result from the anticipation or the opinions in the experimental stage, and thus lack the practical utility and the specifics. It is difficult to attain those by utilizing the existing techniques, and thus it is desirable to provide a new technique with which the molecular level wiring or the like can be realized at the molecular level and from the bottom up. On the other hand, a synthesis example of a metallic complex integrated structure is also reported in a non-patent literary document of W. Huang, S. Gou, D. Hu, S. Chantrapromma, H. Fun, and Q. Meng: Inorg. Chem., 40, 1712 (2001). In many cases, however, the molecules are merely arranged in a ladder shape in terms of results by a weak interaction such as an intermolecular force. Thus, there is a problem that it is difficult to perform packing control. In addition, the arrangement of the resulting molecules in the metallic complex chain greatly depends on the molecular form, the effect of the substituent group, the delicate interaction between the molecules, and the like. As a result, there is a problem that the molecular wire or the like may not sufficiently function as a single wire because even if the chemical modification is performed for the molecular wire or the like, the probability that the molecular wire or the like can take the ladder type structure or the like is low.

Note that, it is reported that in a specimen in which zinc (Zn) cytochrome c is adsorbed at random onto a nano-porous titanium oxide (TiO$_2$) electrode, the electrons excited by radiation of a light to zinc cytochrome c are injected into a conduction band of the nano-porous titanium oxide, thereby generating a photocurrent. This report, for example, is described in a non-patent literary document of Emmanuel Topoglidis, Colin J. Campbell, Emilio Palomares, and James R. Durrant: Chem. Commun. 2002, 1518 to 1519.

In addition thereto, it is reported that in a single molecular film having a two-layer structure of iron (Fe) cytochrome c immobilized onto a gold substrate, and a green fluorescent protein (GFP), the radiation of a light thereto results in generation of a photocurrent. This report, for example, is described in a non-patent literary document of Jeong-Woo Choi and Masamichi Fujihira: Appl. Phys. Lett. 84, 2187 to 2189 (2004).

It is noted that in a single molecular film which is made of peptide and which is immobilized onto a gold substrate, the radiation of a light thereto results in generation of a photocurrent. This report, for example, is described in a non-patent literary document of Shiro Yasutomi, Tomoyuki Morita. Yukio Imanishi, Shunsaku Kimura: Science 304, 1944 to 1947 (2004). In the technique described in the non-patent literary document of Shiro Yasutomi, Tomoyuki Morita, Yukio Imanishi, Shunsaku Kimura: Science 304, 1944 to 1947 (2004), two kinds of peptides having optical responsibilities different from each other are immobilized onto one gold substrate through a simple molecular film made of disulfide as a sulfur compound which results in that a polarity of the photocurrent is controlled in accordance with a wavelength of the radiated light.

In addition, a method of synthesizing zinc cytochrome c is reported in a non-patent literary document of Martin Braun, Stefan Atalick, Dirk M. Guldi, Harald Lanig, Micael Brettreich, Stephan Burghardt, Maria Hatzimarinaki, Elena Ravanelli, Maurizio Prato, Rudi van Eldic, and Andreas Hirsch: Chem. Eur. J. 9, 3867 to 3875 (2003).

Also, a method of forming a gold electrode onto which a single molecule of iron cytochrome c is adsorbed is reported in a non-patent literary document of Ryutaro Tanimura, Michael G. Hill, Emanuel Margoliash, Katsumi Niki, Hiroyuki Ohno, and Harry Gray: Electrochem. Solid-State Lett. 5, E67-E70 (2002).

SUMMARY

In the light of the foregoing, it is therefore desirable to provide a molecular device, a single-molecular optical switching device, and a functional device each of which is capable of being simply structured without using any of complicated chemical synthesis processes, and operating at an ultrafast speed, and with each of which superdense integration is capable of being made.

It is also desirable to provide a molecular wire which is suitable for being used as a wire for various devices, particularly in the molecular device, and single-molecular optical switching device, and functional device described above.

It is also desirable to provide various electronic apparatuses each using the functional device.

The inventors of the present application have earnestly made a study in order to attain the desires described above. The outline of the study will now be described as follows.

For the structuring of a molecular device, an organic molecule is generally used, and there is also a device forming method obtained by combining a synthesis technique thereof, and a bottom up-like technique such as self-assembly. However, in order to develop the function of the molecular device, the situation is quite like that the molecular design is performed, and the complicated synthesis technique having the multistages is exploited to the development of the function of the molecular device, which results in that finally, one device can be structured. As a result, it is difficult to realistically put the molecular device into practical use. In addition, for formation of a single-molecular device, it is also necessary to manipulate one molecule by exploiting an atomic force microscope or an SPM technique such as an optical tweezers technique to the formation of the single-molecular device. In this case, however, it becomes technically difficult to manipulate one molecular because a normal organic molecule is too small in size. A fullerene class typified by C60 is given as a namometer-scale molecule solving this problem. However, the function of fullerene is definite, and thus if the molecular transistor is intended to be manufactured with C60, finally, it is necessary to perform the complicated organic synthesis.

In addition, a carbon nanotube or the like is proposed as the molecular device serving as a wire which transmits the electrons. However, during the adjustment, it is difficult to adjust the lengths of the carbon nanotubes into desire one, and to manipulate the carbon nanotubes while the directional property thereof is maintained. Thus, there is still much works to do. As has been described, the manufacturing of the molecular device using the normal organic molecule or fullerene involves many difficulties, and thus is impractical.

On the other hand, paying attention to proteins, it is understood that many of the problems described above have already been solved from the top. The protein is an amino acid polymer, and some of them take therein the functional molecule (for example, a metallic ion, a metallic complex, a coenzyme, or the like). A structure of the protein is very complicated, and thus the structure optimized in order for the proteins to develop the respective functions is built therein. A protein group, which is called an electron transfer protein, performs delivery and receipt of the electrons exists in functional proteins. Although this electron transfer protein is an insulating material of the protein, it has an ability to deliver and receive the electrons in nanometer scale with very high efficiency because of its artful structure. This fact means that the electron transfer protein previously has the ideal property of the molecular wire which is very hard to realize. In former years, it was difficult to physically interpret the correlative relationship between the function and structure of the protein, and, for example, the electron transfer mechanism of the electron transfer protein was hardly understood at all in situation. However, the recent dramatic progress of the molecular biology and the protein engineering, and the progress of the physical chemistry, particularly in the quantum chemistry have made the electron transfer mechanism clear, and also have allowed the functional alteration of the protein to be readily performed. In other words, it has been in the stage in which it is sufficiently possible to utilize the function which the protein itself previously has in the form of the molecular device. For example, a certain amino acid residue of the protein can also be altered, inserted into a certain place, or deleted. In addition, the interchanging of a partial structure of α-helix or β-sheets has been able to be relatively simply performed. In other words, at present, satisfactorily altering the monomolecule having the nanometer size, and giving the same the desired function are much easier and much more practical than building up the monomolecule having the nanometer size from the organic molecule. In the first place, at the present time, it may be impossible to build up the polymer molecule, such as the protein, which is complicated in structure, and which has a high function and a uniform molecular weight by utilizing the synthetical technique.

An instability nature of the molecular device using the protein may be pointed out as a problem when the molecular device using the protein is manufactured. However, this problem can be sufficiently solved as apparent from a viewpoint as well of both the progress of the protein engineering, and the fact that in the first place, the protein derived from the thermophila is very stable in property. Thus, altering the protein itself so as to be capable of utilizing the very high function which the protein has is the shorter cut to realization of the molecular device than adopting any other way.

So, the inventors of the present application have earnestly made an investigation in order to clear up the above-mentioned problems which the related art involves once at all by realizing the molecular device using the protein. As a result, as will be described later, the inventors of the present application make a hit about the observation of a bidirectional photocurrent following photoexcitation in zinc cytochrome c as a kind of electron transfer protein on the first time, and also substantially resolve the mechanism of the bidirectional photocurrent following photoexcitation in zinc cytochrome c. As a result of further making an investigation based on this knowledge, the inventors of the present application have reached the device of the present application.

That is to say, in order to solve the problems described above, according to a first embodiment, there is provided a molecular device, including: at least one molecule of zinc cytochrome c; in which an electron or a hole is transferred within the at least one molecule of zinc cytochrome c by utilizing transition of an electron between molecular orbitals of the at least one molecule of zinc cytochrome c.

Here, the molecular orbitals involved in the transition of the electron may be basically any ones as long as a result of the transition of the electron between them, either the electron or the hole is transferred from a certain position within the at least one molecule of zinc cytochrome c to another position located apart from the certain position within the at least one molecule of zinc cytochrome c. Specifically, these molecular orbitals, for example, are a first molecular orbital which is localized in a first amino acid residue of the at least one molecule of zinc cytochrome c, and a second molecular orbital which is localized in a second amino acid residue of the at least one molecule of zinc cytochrome c and which has a maximum transition probability per unit time with respect to the first molecular orbital. In this case, either the electron or the hole is transferred between the first amino acid residue and the second amino acid residue. At this time, the first amino acid residue and the second amino acid residue constitute a start point and an end point of the transfer of either the electron or the hole, respectively. Typically, an electron or a hole is generated in one of the first molecular orbital and the second molecular orbital by photoexcitation. However, either the electron or the hole may also be generated therein by utilizing any other suitable method, for example, application of an electric field. In addition, these molecular orbitals, for example, are a molecular orbital which is localized in an a certain amino acid residue and zinc porphyrin of zinc cytochrome c, and a molecular orbital which is located in another amino acid residue and which has a maximum transition probability per unit time with respect to the former molecular orbital. In this case, either the electron or the hole is transferred between the former amino acid residue and the latter amino acid residue. Moreover, the molecular orbitals, for example, may also be a molecular orbital which is localized in zinc porphyrin of zinc cytochrome c, and a molecular orbital which is localized in another amino acid residue and which has a maximum transition probability per unit time with respect to the former molecular orbital. In this case, either the electron or the hole is transferred between the former zinc porphyrin and the latter molecular orbital.

The velocity of the electron transfer following the transition of the electron from a certain molecular orbital to another molecular orbital is described by the following Fermi's golden rule (refer to a literature of Dirac, P. A. M. (1927):

Proc. Roy. Soc. (London) A 114, 243 to 265, and a literature of Fermi, E.: Nuclear Physics, University of Chicago Press (1950).) expressed by Expression (1)

$$k_{ET} = \frac{2\pi}{\hbar} |\langle f | H' | i \rangle|^2 \rho(E_{fi}) \qquad (1)$$

where $|\langle f|H'|i\rangle|$ is a magnitude of transfer integral with which the electron transits from a start state $|i\rangle$ (molecular orbital i) to an end state $|f\rangle$ (molecular orbital f) based on an interaction H', $\rho(E_{fi})$ is a density of states when the electron transits from one molecular orbital to the molecular orbital f, and $E_{fi}$ is an energy difference between the molecular orbital f and the molecular orbital i.

When $|\langle f|H'|i\rangle|$ is further transcribed, and $\rho(E_{fi})$ is replaced with its approximate expression, Expression (1) is transformed into Expression (2):

$$k_{ET} = \frac{2\pi}{\hbar} |\langle X_f | X_i \rangle|^2 |\langle f | H | i \rangle|^2 \delta(E_{fi}) \qquad (2)$$

where a first term is a Frank-Condon term (an effect of a vibration portion), a second term is a transfer integral (an effect of an electron portion), and a third term is an approximate expression of the density of states which is expressed by a delta function of Dirac.

Zinc cytochrome c constituting the molecular device, for example, can be immobilized in the form of at least one molecule, single-molecular film or multimolecular film onto an electrode made of a conductive material, and also can be immobilized thereonto by, for example, the electrostatic bonding or the chemical bonding. A plurality of first electrodes may be formed on a substrate separately from one another, and one or a plurality of zinc cytochrome c may be immobilized onto the plurality of first electrodes, respectively. The immobilizing of the zinc cytochrome c onto the respective first electrodes either may be directly performed, or may be indirectly performed, for example, through an intermediate layer made of an organic compound having a hetero atom such as a sulfur atom. Preferably, a layer which can prevent the phenomenon that after the electrons generated by the photoexcitation in zinc cytochrome c are transferred to the electrode, they return back to zinc cytochrome c again, that is, the backward electron transfer, in other words, which has a rectifying property is used as the intermediate layer. A single-molecular film made of disulfide as a sulfur compound, for example, can be given as the intermediate layer (refer to the non-patent literary document of Shiro Yasutomi, Tomoyuki Morita, Yukio Imanishi, Shunsaku Kimura: Science 304, 1944 to 1947 (2004)). When zinc cytochrome c is directly immobilized onto the first electrode, a conductive material of which the first electrode is made is preferably one which is excellent in immobilizing ability. On the other hand, when zinc cytochrome c is indirectly immobilized onto the first electrode through the intermediate layer, a conductive material of which the first electrode is made is preferably one which is excellent in ability to immobilize the intermediate layer. Specifically, a metal such as gold, platinum or silver, a metallic oxide such as an ITO (indium-tin composite oxide), an FTO (fluorine-doped tin oxide) or a Nesa glass ($SiO_2$ glass), or an inorganic material typified by a glass can be used as the conductive material for the first electrode. In addition thereto, a conductive polymer (such as polythiophene, polypyrrole, polyacetylene, polydiacetylene, polyparaphenylene, or polyparaphenylene sulfide), a charge-transfer complex (such as TTF-TCNQ) containing therein tetrathiafulvalene derivative (such as TTF, TMTSF or BEDT-TTF), or the like can also be used as the conductive material for the first electrode. A surface shape of the first electrode may be an arbitrary shape such as a depressed surface, a projected surface, or a depressed and projected surface. In this case, zinc cytochrome c can be readily immobilized onto any of these shapes. Zinc cytochrome c may be sandwiched between the first electrode and another electrode. The same conductive material as that for the first electrode described above can be used as the conductive material for the other electrode as well. When a light is made incident through one of these electrodes, at least one of these electrodes is structured so as to transmit a visible light. The structure in which zinc cytochrome c is sandwiched between these electrodes, for example, can be used in the form of a photoelectric conversion element.

This photoelectric conversion element can be operated in any of a solution (electrolyte solution), and a dry environment as long as neither of the photoelectric conversion function and electron transfer function of zinc cytochrome c is impaired. For example, when the photoelectric conversion element is operated in the electrolyte solution, typically, the other electrode is provided at a distance so as to face zinc cytochrome c immobilized onto one electrode. Also, those electrodes are immersed in the electrolyte solution. An electrolyte in which an oxidation reaction occurs in one electrode, and a reduction reaction occurs in the other is used as one (or. a Redox) of the electrolyte solution. Specifically, for example, $K_4[Fe(CN)_6]$, $[Co(NH_3)_6]Cl_3$ or the like is used as this sort of electrolyte (or, the Redox). On the other hand, when the photoelectric conversion element is operated in the dry environment, typically, for example, a solid electrolyte not adsorbing zinc cytochrome c, specifically, for example, the wet solid electrolyte such as an agar or a polyacrylamide gel is sandwiched between zinc cytochrome c immobilized onto one electrode, and the other. Preferably, a sealing wall for preventing the drying of the solid electrolyte is provided in the peripheral of the solid electrolyte. In those cases, when a light receiving portion made of zinc cytochrome c receives a light, the photocurrent can be obtained with a polarity based on a difference in natural electrode potential between these opposite electrodes.

In this photoelectric conversion element, the adjustment of at least one of the potential difference between these opposite electrodes, the intensity and the wavelength of of the light radiated to zinc cytochrome c makes it possible to change the magnitude and/or the polarity of the photocurrent caused to flow through the inside of the element. Here, the potential difference between these opposite electrodes means both a bias voltage generated artificially by the application of the voltage, and the different in natural electrode potential between the first electrode and the second electrode.

The photoelectric conversion element, for example, can be used in a photodetector (optical sensor), and can be used together with an amplifier circuit for amplifying the photocurrent as may be necessary. The photodetector can be used in various applications such as detection of an optical signal, and thus can also be applied to an artificial retina or the like. Also, the photoelectric conversion element can also be used in the form of a solar cell.

The photoelectric conversion element can be used in various devices, apparatuses and the like each utilizing the photoelectric conversion. Specifically, the photoelectric conversion element, for example, can be used in the electronic apparatuses or the like each having a light receiving portion.

The photoelectric conversion element may also be used in a semiconductor device. In this semiconductor device, the photoelectric conversion element is immobilized on a semiconductor substrate. Tropically, a semiconductor device, an electronic circuit or the like for amplifying a photocurrent taken out from the photoelectric conversion element is formed on the semiconductor substrate by utilizing the semiconductor technology well known in the related art. The semiconductor substrate either may be a semiconductor substrate made of an elementary semiconductor such as Si, or may be a semiconductor substrate made of a compound semiconductor such as GaAs. The semiconductor device, for example, can be structured in the form of an opto-electronic integrated circuit (IC) device. In the opto-electronic IC device, for example, in addition to the photoelectric conversion element a light emitting element such as a semiconductor laser or a light emitting diode, an electronic circuit, and the like are formed on the semiconductor substrate. In this case, a light emitted from the light emitting element may be made incident to the photoelectric conversion element. Although the function and application of the semiconductor device have various uses, specifically, the semiconductor device is applied to a photodetector, an optical signal processor, an image pickup element (such as a MOS image sensor or a charge coupled device (CCD)) or the like.

According to a second embodiment, there is provided a single-molecular optical switching device, including: one molecule of zinc cytochrome c, an electron or a hole being transferred within the one molecule of zinc cytochrome c by utilizing transition of an electron between molecular orbitals of the one molecule of zinc cytochrome c; in which wirings are connected to a plurality of amino acid residues different from one another of the one molecule of zinc cytochrome c, respectively. Also a first molecular orbital and a second molecular orbital are localized in a first amino acid residue and a second amino acid residue which are arbitrarily selected from the plurality of amino acid residues, respectively, and the second molecular orbital has a maximum transition probability per unit time with respect to the first molecular orbital.

Here, the connection of the wirings to the plurality of amino acid residues is performed by connecting the molecular wire known in the related art, a molecular wire using zinc cytochrome c as will be described later, or any other suitable conductive molecule such as DNA by using a suitable linker as may be necessary.

In the second embodiment, the contents which have been described in conjunction with the first embodiment of the present application are established unless they violate the essence of the contents of the first embodiment.

According to a third embodiment, there is provided a functional device, including: at least one molecule of zinc cytochrome c; in which an electron or a hole is transferred within the at least one molecule of zinc cytochrome c by utilizing transition of an electron between molecular orbitals of the at least one molecule of zinc cytochrome c.

Here, the functional device may be basically any one as long as it performs some kind of function by utilizing the conductivity of the at least one molecule of zinc cytochrome c generated along with the transition of the electron between the molecular orbitals. The functional device is suitable for building up a switching device, particularly in the single-molecular optical switch for performing a switching operation by receiving a light radiated thereto, an integrated circuit device having a circuit device structured by paving a substitute with the molecules of zinc cytochrome c, a matrix circuit, a molecular functional device, a logic circuit, or the like. Thus, the functional device can be applied to the miniaturization and refinement of various devices and apparatuses such as an arithmetic device, a display device, and a memory in an information communication field.

In the third embodiment, the contents which have been described in conjunction with the first and second embodiments of the present application are established unless they violate the essence of the contents of the first and second embodiments.

According to a fourth embodiment, there is provided a molecular wire, including: at least one molecule of zinc cytochrome c; in which an electron or a hole is transferred within the at least one molecule of zinc cytochrome c by utilizing transition of an electron between molecular orbitals of the at least one molecule of zinc cytochrome c.

Here, the molecular wiring, typically, is formed by coupling plural molecules of zinc cytochrome c in series with one another so as to obtain a length and a wiring distributing shape corresponding to a wiring distance. However, the molecular wiring may contain therein any other suitable electron transfer protein such as a conductive material, other than zinc cytochrome c, such as iron cytochrome c. As a result, for example, the electrons generated in zinc cytochrome c at one terminal of the molecular afire by the photoexcitation can be transferred in order between the electron transfer proteins to be transferred to the other terminal of the molecular wire. A DNA wiring may be wired in the middle of the molecular wire.

In the fourth embodiment, the contents which have been described in conjunction with the first embodiment of the present application are established unless they violate the essence of the contents of the first embodiment.

According to a fifth embodiment, there is provided an electronic apparatus having one or a plurality of functional devices; in which the electronic apparatus uses a functional device, having at least one molecule of zinc cytochrome c, for transferring an electron or a hole within the at least one molecule of zinc cytochrome c by utilizing transition of an electron between molecular orbitals of the at least one molecule of zinc cytochrome c as the at least one functional device.

The functions and applications of the electronic apparatus have various uses, and thus the electronic apparatus may be any of various electronic apparatuses and includes both mobile type one and stationary type one. In this case, a digital camera, a camera-integrated video tape recorder (VTR), and the like are given as concrete examples of the electronic apparatus.

In the fifth embodiment, the contents which have been described in conjunction with the first and fourth embodiments of the present application are established unless they violate the essence of the contents of the first and fourth embodiments.

According to a sixth embodiment, there is provided a molecular device, including: at least one molecule of electron transfer protein: in which an electron or a hole is transferred within the at least one molecule of electron transfer protein by utilizing transition of an electron between molecular orbitals of the at least one molecule of electron transfer protein.

According to a seventh embodiment; there is provided a single-molecular optical switching device, including: one molecule of electron transfer protein, an electron or a hole being transferred within the one molecule of electron transfer protein; in which wirings are connected to a plurality of amino acid residues different from one another of the one molecule of electron transfer protein, respectively. Also a first molecular orbital and a second molecular orbital are localized in a first amino acid residue and a second amino acid residue which are arbitrarily selected from the plurality of amino acid residues, respectively, and the second molecular orbital has a maximum transition probability per unit time with respect to the first molecular orbital.

According to an eighth embodiment, there is provided a functional device, including: at least one molecule of electron transfer protein; in which an electron or a hole is transferred within the at least one molecule of electron transfer protein by utilizing transition of an electron between molecular orbitals of the at least one molecule of electron transfer protein.

According to a ninth embodiment, there is provided a molecular wire, including: at least one molecule of electron transfer protein; in which an electron or a hole is transferred within the at least one molecule of electron transfer protein by utilizing transition of an electron between molecular orbitals of the at least one molecule of electron transfer protein.

According to a tenth embodiment, there is provided an electronic apparatus having one or a plurality of functional devices; in which the electronic apparatus uses a functional device, having at least one molecule of electron transfer protein, for transferring an electron or a hole within the at least one molecule of electron transfer protein by utilizing transition of an electron between molecular orbitals of at least one molecule of the electron transfer protein as the at least one functional device.

In the sixth to tenth embodiments, the electron transfer protein is generally the electron transfer protein containing therein a metal. Preferably, the metal is a transition metal (for example zinc, iron, or the like) which has an electron in an orbital having an energy equal to or higher than that of a d orbital. Although the electron transfer protein is an iron-sulfur protein class (such as rubredoxin, 2-iron ferredoxin, 3-iron ferredoxin, or 4-iron ferredoxin), a blue copper protein class (such as plastcyanin, azurin, pseudoazurin, plantacyanin, stelacyanin, or amicyanin), or a cytochrome class (such as cytochrome c (such as zinc cytochrome c), cytochrome b. cytochrome b5, cytochrome c1, cytochrome a, cytochrome $a_3$, cytochrome f, or cytochrome b6), the present application is by no means limited thereto. For example, the present application is also applied to derivatives of these electron transfer proteins (in each of which a amino acid residue of a skeleton is chemically modified) or variants thereof (in each of which another amino acid residue is substituted for a part of an amino acid residue of a skeleton).

In an embodiment, the superdense integration can be made because zinc cytochrome c or the electron transfer protein as the protein has the nanometer size. In addition, these proteins are the uniform functional polymers each having the nanometer size. Thus, using the naturally-derived protein as the raw material makes it possible to keep the necessary synthesis reaction to the minimum. As a result, not only such proteins can be simply obtained without using any of the complicated chemical synthesis processes as in the organic semiconductor, but also the manipulation for a single molecule can be readily managed starting with the organic molecule having the angstrom size by utilizing the SPM technique. In addition, the high-speed photocurrent response characteristics can be obtained from these proteins through the photoexcitation. Also, in these proteins, the commingling of the noises is suppressed because the periphery of the electron transfer path is covered with the amino acid residue as the insulator. Moreover, a start point and an end point of the transfer of either the electron or the hole are determined. Thus, for example, such a portion is connected to a bulk electrode, for example, made of any other suitable functional molecule or functional protein, or a metal, thereby making it possible to form an integrated circuit. In addition, the protein has a feature of the specific molecular recognition. Thus, performing a design utilizing the molecular recognizing ability results in that the functional molecules (proteins) each having the nanometer size can be self-integrated as a designer wishes. In this case, the process thereof is simplified.

According to an embodiment, it is possible to realize the molecular device, the single-molecular optical switching device, and the functional device each of which can be simply structured without using any of the complicated chemical synthesis processes, can operate at a speed approaching light, and superdensely integrated. In addition, it is possible to realize the molecular wire which is suitable for being used in a wiring for the various devices, particularly in the molecular device, the single-molecular optical switching device, and the functional device. Also, it is possible to realize the high-performance electronic apparatus using the functional device.

Additional features and advantages are described herein, and will be apparent from the following Detailed Description and the figures.

BRIEF DESCRIPTION OF THE FIGURES

FIG. 23 is a plan view showing model molecules of zinc porphyrin;

FIG. 24 is a side view showing 144-th and 145-th molecular orbitals of a model molecule of zinc porphyrin;

FIG. 26 is a schematic view showing molecular orbitals of zinc cytochrome c;

FIG. 27 is a schematic view showing molecular orbitals of zinc cytochrome c;

FIG. 28 is a schematic view showing molecular orbitals of zinc cytochrome c;

DETAILED DESCRIPTION

Embodiments of the present application will be described in detail hereinafter with reference to the accompanying drawings.

Firstly, a description will now be given with respect to results of experiments performed using zinc cytochrome c as an example of an electron transfer protein.

Figure 1A:
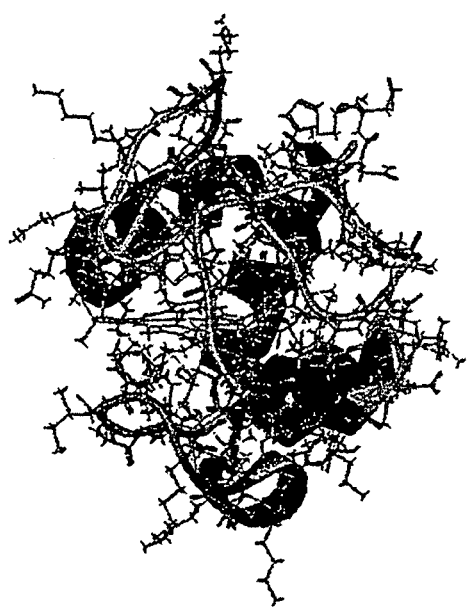
FIGS. 1A and 1B are respectively schematic views each showing a molecular structure of zinc cytochrome c.
Figure 1B:

FIGS. 1 and 1B are respectively views showing ribbon models of zinc cytochrome c. FIG. 1A is a view showing a ribbon model of zinc cytochrome c in which an amino acid side-chain is also shown. FIG. 1B is a view showing another ribbon model of zinc cytochrome c in which an illustration of the amino acid side-chain is omitted. The number of amino acid residues of zinc cytochrome c is 104. Zinc is coordinated as a central metal in porphyrin located at a center of zinc cytochrome c, and becomes a center of optical absorption or a photoinduced electron-transfer reaction. A protein portion surrounding porphyrin of zinc cytochrome c is an insulator. Zinc cytochrome c has characteristic absorption peaks called a Soret band and a Q band in a visible light region, and can be photoexcited by a visible light.

Experiment 1

1. Manufacture of Specimen

Figure 2:
FIG. 2 is a photograph, substituting for a drawing, showing a drop-shaped gold electrode supporting zinc cytochrome c.

A member having a drop-like shape with a diameter of several millimeters which is obtained by melting an end of a highly-pure gold wire is used as an electrode. The drop-shaped gold member is immersed in an ethanol solution of 10-carboxy-1-decanethiol $(HS(CH_2)_{10}COOH)$, thereby forming a self-assembled monolayer (SAM) of $(HS(CH_2)_{10}COOH)$ as an intermediate layer on a surface of the drop-shaped gold member. The resulting SAM electrode is immersed in a 10 mM Tris-HCl buffer solution (pH: 8.0) of zinc cytochrome c, thereby manufacturing a two layer-structure SAM electrode in which $HS(CH_2)_{10}COOH$ and zinc cytochrome c are adsorbed on the surface of the drop-shaped gold member. Hereinafter, the two layer-structure SAM electrode is referred to as a zinc cytochrome c electrode. FIG. 2 shows this zinc cytochrome c electrode. It is noted that the synthesis of zinc cytochrome c is performed in accordance with the technique described in the non-patent literary document of T. M. Rice, S. Gopalan and M. Sigrist: Europhys. Lett., 23, 445 (1993). In addition, the manufacture of the zinc cytochrome c electrode was performed in imitation of the method of manufacturing an iron cytochrome c electrode described in the non-patent literary document of J. H. Schon, Ch. Kolc, B. Batlogg: Nature, 406, 702(2000).

2. Preparation of Measurement

Figure 3:
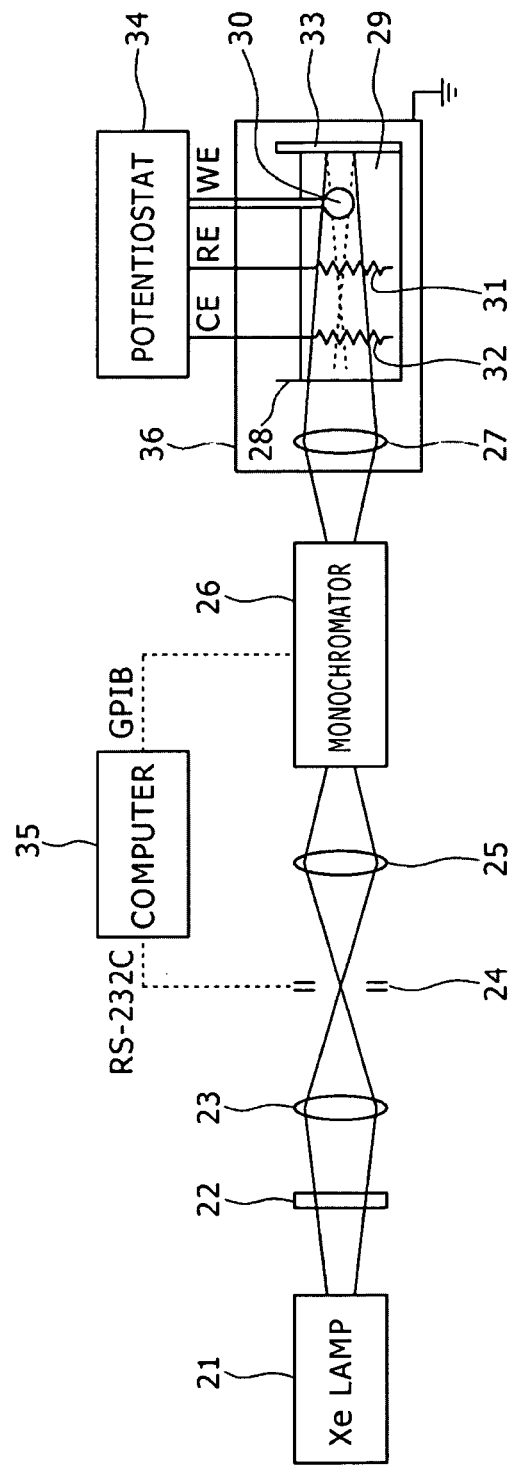
FIG. 3 is a schematic block diagram showing a three-electrode measurement system.

There is a prepared optical experimental system that a monochromatic light can be evenly radiated to the surface of the zinc cytochrome c electrode, and moreover a timing of the light radiation can be controlled by opening and closing of a shutter. Also, the zinc cytochrome c electrode, a silver wire, and a platinum wire are used as a work electrode, a reference electrode, and a counter electrode, respectively, and are connected to a potentiostat. Also, three electrodes are immersed in a 10 mM phosphoric acid buffer aqueous solution (pH: 7.0) containing therein 2.5 mM $K_4[Fe(CN)_6]$. The experimental system is shown in FIG. 3. In the figure, reference numeral 21 designates a Xe lamp (150 W) as a light source, reference numeral 22 designates a cold filter which efficiently transmits a visible light of an emission spectrum of the Xe lamp 21 and reflects a heat ray, and reference numeral 23 designates a condenser lens. In addition, reference numeral 24 designates a shutter (which operates at 0.5 Hz) for controlling transmission and non-transmission of the light by its opening and closing, reference numeral 25 designates a condenser lens, reference numeral 26 designates a monochromator for extracting a monochromatic light having a desired wavelength by spectrally diffracting the light passed through the shutter 24, reference numeral 27 designates a condenser lens, and reference numeral 28 designates a vessel. In addition, reference numeral 29 designates the phosphoric acid buffer aqueous solution containing therein $K_4[Fe(CN)_6]$, reference numeral 30 designates the zinc cytochrome c electrode as the work electrode, reference numeral 31 designates the silver wire as the reference electrode, and reference numeral 32 designates the platinum wire as the counter electrode. Also, reference numeral 33 designates an Al mirror for reflecting the monochromatic light extracted by the monochromator 26, and reference numeral 34 designates the potentiostat. The opening and closing operation of the shutter 24, and the wavelength of the monochromatic light extracted by the monochromator 26 can be controlled by a computer 35. The condenser lens 27 and the vessel 28 are entirely covered with a shielding member 36, made of a metal, for blocking incidence of an outside light except for an intake for the monochromatic light extracted by the monochromator 26. The shielding member 36 is grounded.

3. Observation of Photocurrent

Figure 4:
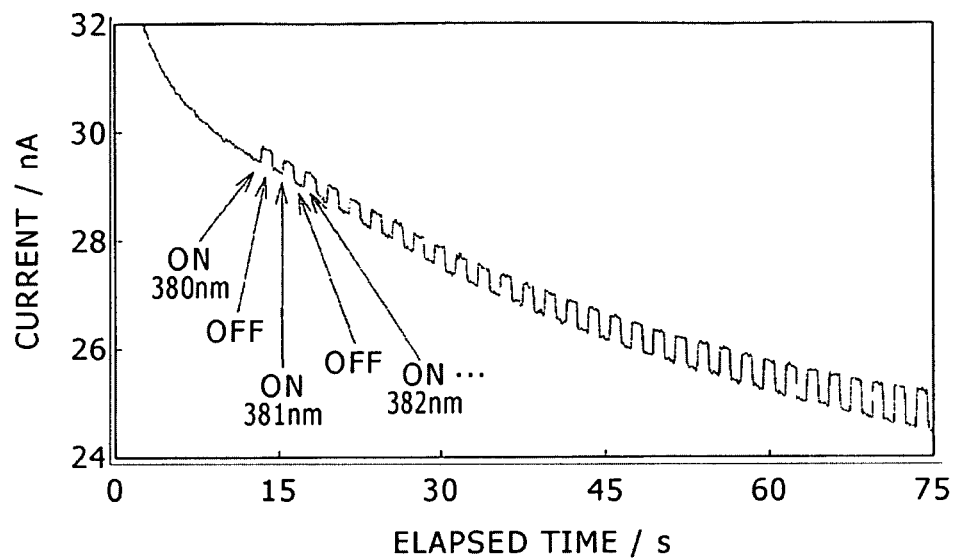
FIG. 4 is a graph showing evaluation results obtained by using the three-electrode measurement system shown in FIG. 3.

A bias voltage which is +313 mV with respect to the potential of the silver wire 31 is applied to the zinc cytochrome c electrode 30 with the shutter 24 being closed, and the optical experimental system is left at rest for 60 seconds while this state is maintained. At this time, a dark current gradually decreases. Next, the shutter 24 is opened, and a light having a wavelength of 380 nm is radiated for one second. Then, the shutter 24 is closed again, and the optical experimental system is halted for one second. After that, a light having a wavelength of 381 nm is radiated for one second, and the optical experimental system is halted for one second. Then, a light having a wavelength of 382 nm is radiated for one second, and the optical experimental system is halted for one second. In such a manner, a wavelength of a light is swept on a 1 nm-by-1 nm basis while the radiation of the light, and the halt of the optical experimental system are repeatedly performed at intervals of one second. A change of a current value with time in a process of such intermittent light radiation is measured. As a result, a pulse-like current change synchronized with ON/OFF of the radiated light, that is, a photocurrent is observed. The observation results are shown in FIG. 4.

Figure 5:
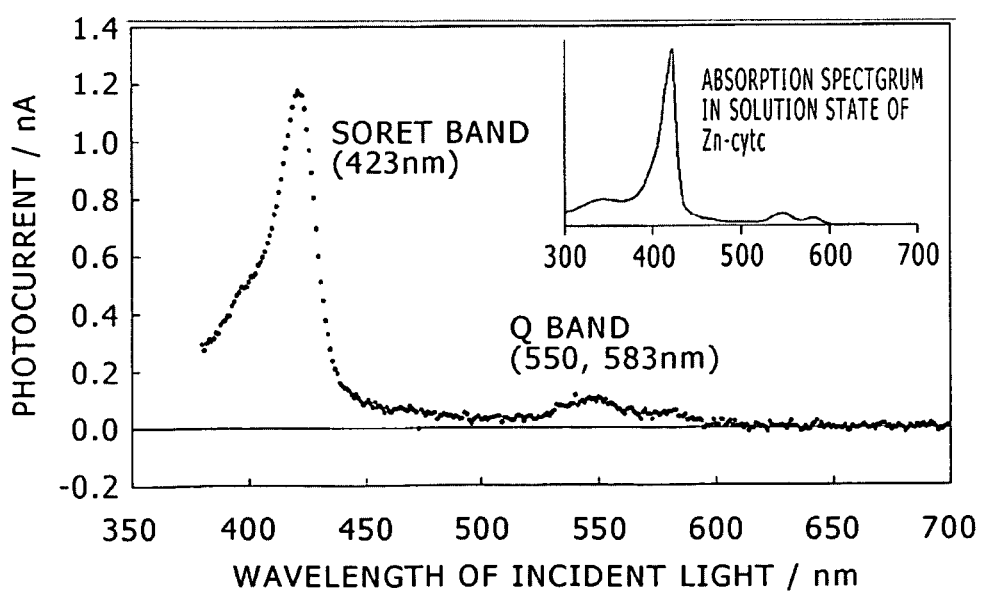
FIG. 5 is a graph showing evaluation results obtained by using the three-electrode measurement system shown in FIG. 3.

An average value of widths of rising edges, and widths of falling edges in the individual pulses obtained from the measurement described above is obtained, and is set as a photocurrent value. Also, a photocurrent action spectrum is obtained by plotting the photocurrent values in the respective wavelengths (refer to FIG. 5). The resulting photocurrent action spectrum has a similar shape to that of the absorption spectrum of zinc cytochrome c. From this, it is confirmed that the photocurrent follows the photoexcitation of zinc cytochrome c.

Figure 6:
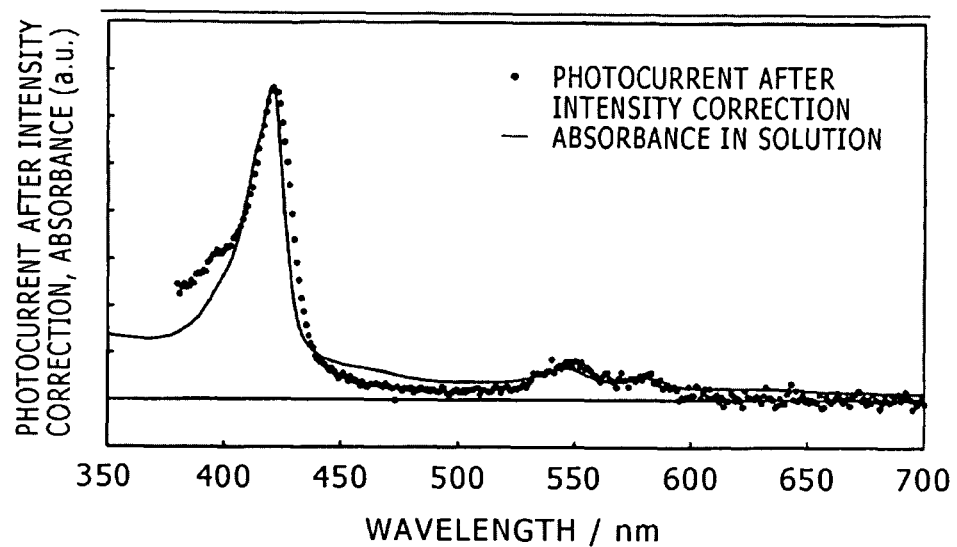
FIG. 6 is a graph showing evaluation results obtained by using the three-electrode measurement system shown in FIG. 3.
Figure 7:
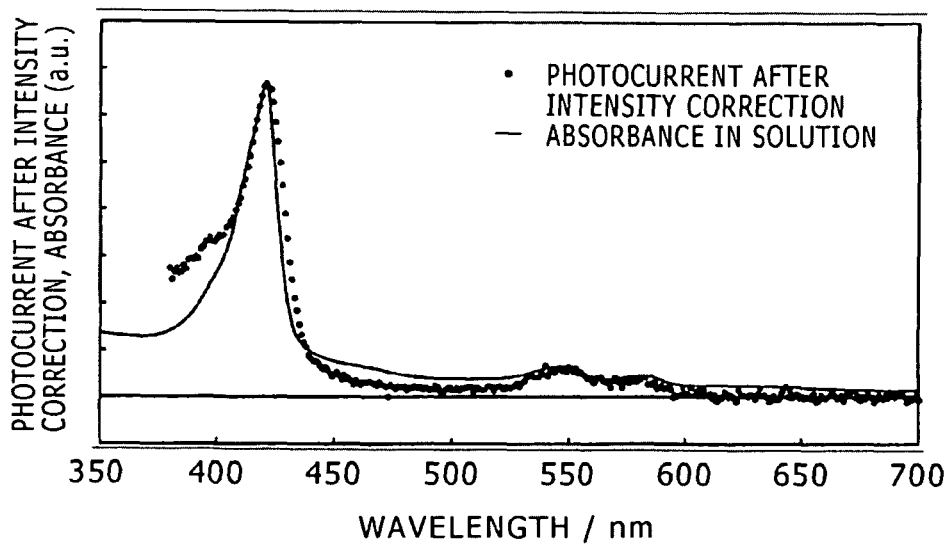
FIG. 7 is a graph showing evaluation results obtained by using the three-electrode measurement system shown in FIG. 3.

FIG. 6 shows a spectral diagram in which the resulting photocurrent action spectrum is corrected on the assumption that an intensity of an incident light is constant. FIG. 7 shows a spectral diagram in which the resulting photocurrent action spectrum is corrected on the assumption that the number of incident photons is constant.

4. Control for Direction and Magnitude of Photocurrent

Figure 8:
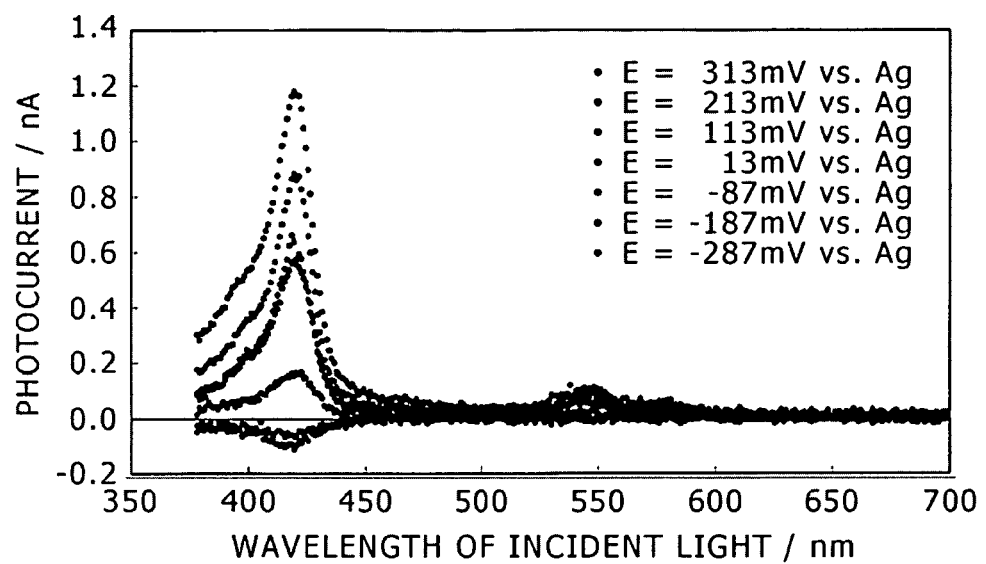
FIG. 8 is a graph showing evaluation results obtained by using the three-electrode measurement system shown in FIG. 3.

As shown in FIG. 8, the adjustment of the bias voltage applied to the zinc cytochrome c electrode 30 makes it possible to control both a polarity (flow direction) and a magnitude of the photocurrent.

5. Inversion of Stationary Current Direction by Light Radiation

Figure 9:
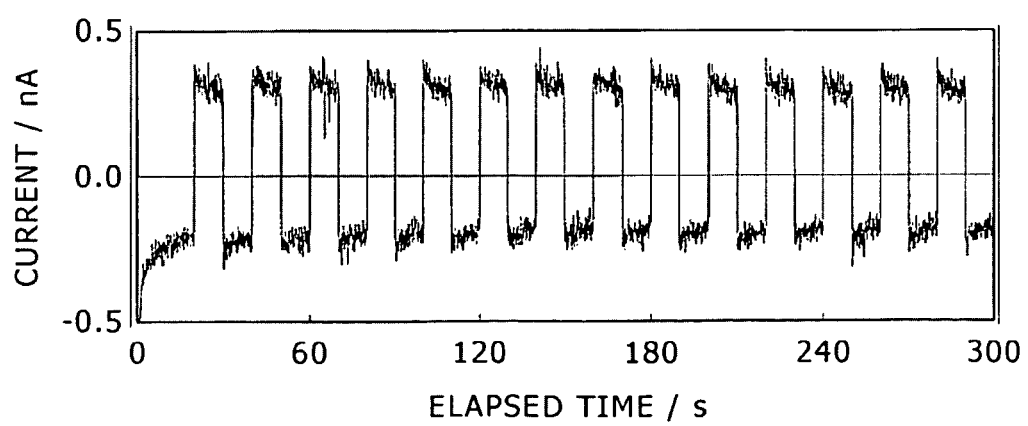
FIG. 9 is a graph showing evaluation results obtained by using the three-electrode measurement system shown in FIG. 3.

As shown in FIG. 9, when the bias voltage to be applied to the zinc cytochrome c electrode 30 is set as such a bias voltage (+23 mV vs. Ag in this case) that a very weak negative current is obtained in a dark place, a polarity of this current could be inversed by the light radiation.

Figure 10:
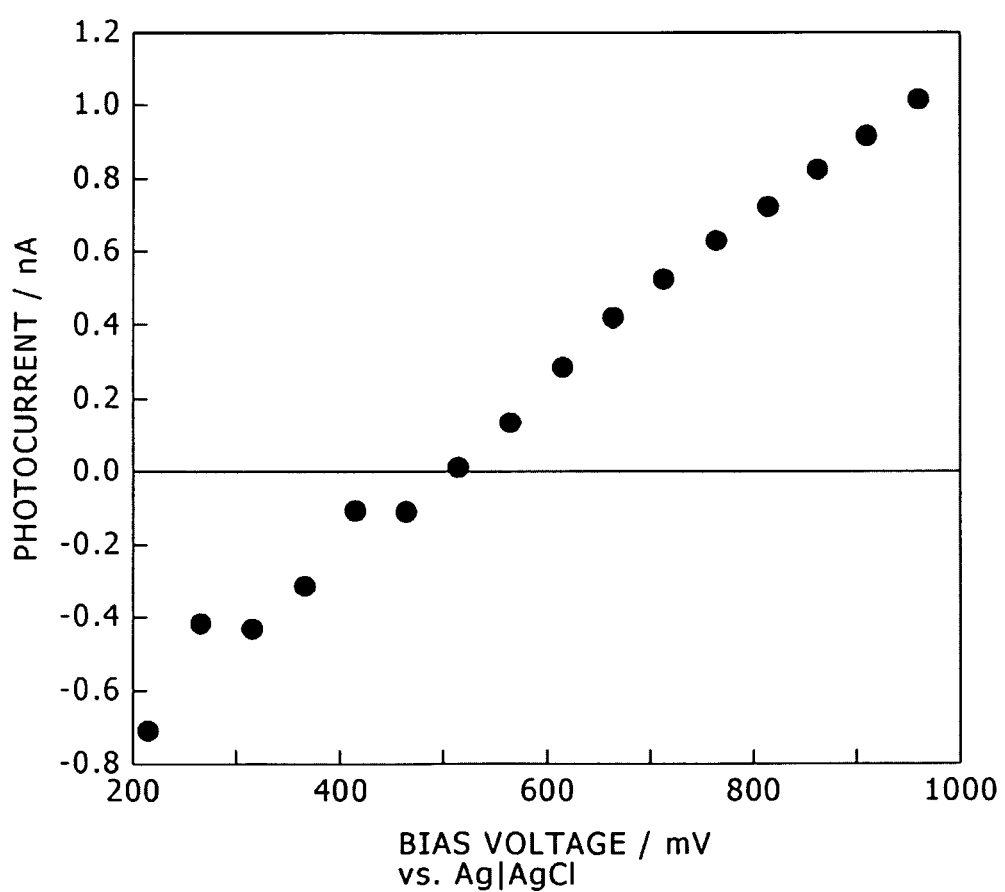
FIG. 10 is a graph showing evaluation results obtained by using the three-electrode measurement system shown in FIG. 3.

From the experiment 1, it is found out that the bidirectional photocurrent is obtained in the zinc cytochrome c electrode 30. Next, bias voltage dependency of the photocurrent is measured. The measurement results are shown in FIG. 10. When the bias voltage is changed while a light having a wavelength of 420 nm is radiated, it is found out that the photocurrent shows linear response to the bias voltage. Thus, it is found out that the zinc cytochrome c electrode 30 acts as a photoconductor.

<Calculation of All Electrons in Zinc Cytochrome c by Density Functional Formalism Theory>

As has been described, it is confirmed that the protein-derived bidirectional photocurrent response is obtained in the zinc cytochrome c electrode 30. Also, it is made clear that the mechanism for generating the bidirectional photocurrent is of a pigment sensitization type. However, it is estimated that in order that the protein as the insulator may bidirectionally generate the photocurrent, the zinc cytochrome c electrode 30 has some sort of special mechanism. In addition, it has been found out that zinc cytochrome c itself exerts the performance as the photosensor. However, in order to perform the device design while controlling these facts at the molecular level, it is necessary to know the electronic property of the protein itself. In order to attain this, it is necessary, to perform the electronic state calculation for the protein in terms of a first principle. There is also a method of calculating the electronic state of the protein by utilizing the semiempirical molecular orbital method. However, this method may not be practically used because it involves the following problems: (1) acceptable results may not be obtained in the metallic protein, such as zinc cytochrome c, containing therein a transition metal (no calculation can be performed at all), (2) although an error occurs because of use of the parameter method, the error which is allowed in a low molecule is beyond the tolerance in the calculation of a giant molecule such as the protein, and so forth. So, it is necessary to perform the electronic state calculation by utilizing a density functional formalism Theory (DFT). However, this method is very expensive in calculation, and at the same time is severe in conversion condition. Thus, it is very important how a initial molecular orbital is made to be of good birth. A program package called proteinDF is known as a program in which a device is made for such circumstances (refer to a literature of Hiroshi Kashiwagi et al.: "Protein Quantum Chemical Calculation-Dream and Realization of ProteinDF", Advance Soft). All the calculations are performed this time by using this proteinDF.

<Building-up of Calculation Model of Zinc Cytochrome c>

The 1M60 recorded in a Protein Data Bank (PDB) is adopted as the structure of zinc cytochrome c used in the calculation. This structure is determined by NMR, and thus unlike one obtained by the X-ray crystal structure analysis, even positions of hydrogen atoms are determined. A procedure thereof will be described hereinafter. All pretreatment operations are carried out by using DS Modeling 1.5.

1) Acquisition of the structure of zinc cytochrome c from the PDB.

2) Molecular mechanics (MM) Calculation (RMS condition: 0.00001) based on solvent approximation by utilizing a Generalized Born method. A force field is CHARMm. In this case, the structure of zinc porphyrin as a hetero molecule is fixed.

3) Neutralization treatment: $Cl^-$ is added to each of lysine (Lys) and arginine (Arg), and $Na^+$ is added to each of a glutamine acid (Glu) and an asparagines acid (Asp). A simple neutralization treatment is performed for an element to which none of $Cl^-$ and $Na^+$ can be added.

4) Disposition of TIP3 water

5) The protein portion is immobilized, and any other portion is optimized in structure by MM.

(an RMS condition in a vacuum model: 0.00001)

6) Deletion of TIP3.

7) Zinc porphyrin is deleted, hydrogen is generated in S of each of Cys14 and Cys17 covalently bounded to zinc porphyrin, and only two hydrogen atoms are cleaned.

8) Creation of a PDB type file: In this case, $Na^+$ is set as a point charge of +1, and $Cl^-$ is set as a point charge of -1.

Figure 11:
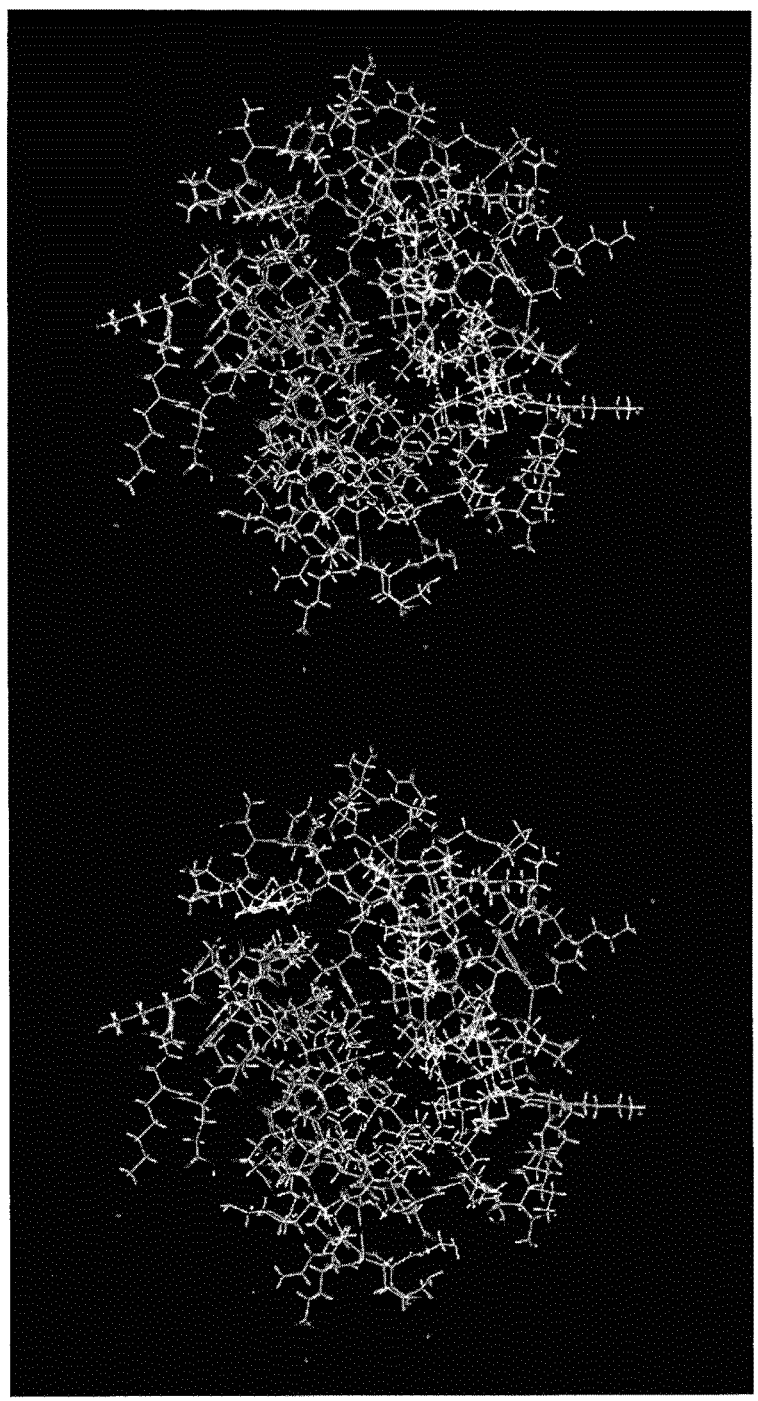
FIG. 11 is a stereo view of apo-zinc cytochrome c.

An apo-body of zinc cytochrome c is made by utilizing this method (refer to FIG. 11). The calculation is made to advance based on this structure in accordance with the following scenario.

<Calculation Scenario>

DFT calculations for the amino acid residues from 1-st one to 104-th one on a one residue-by-one residue basis.

2) DFT calculations for the amino acid residues from 1-st one to 104-th one on a three residues-by-three residues basis based on the molecular orbitals (MO) calculated in Step 1): 1-st one to 3-rd one, 2-nd one to 4-th one, 3-rd one to 5-th one, . . . , 101-th one to 103-th one, and 102-th one to 104-th one.

Figure 12:
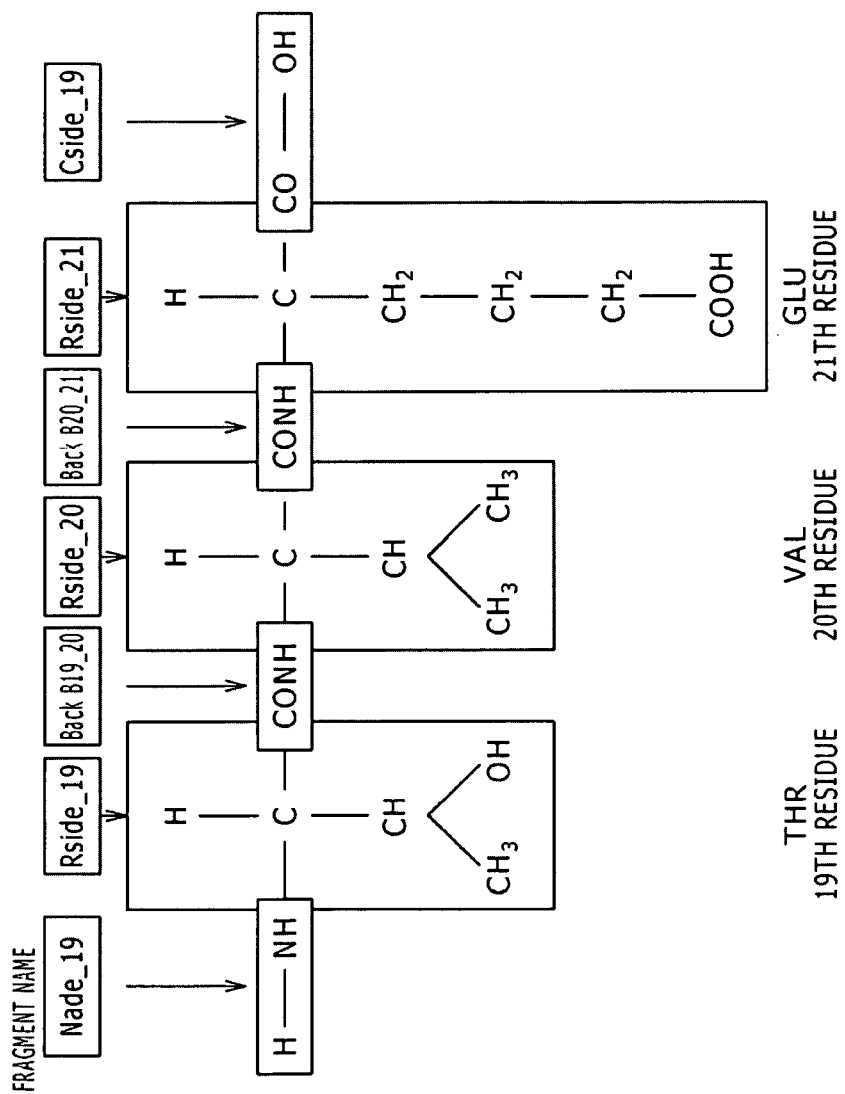
FIG. 12 is a conceptual view of frame partition when calculation is performed by using a proteinDF.

3) Creation of quasi-canonical localized orbitals (QCLO) of the fragments (refer to FIG. 12).

4) The QCLO obtained in Step 3) is set as an initial $MO_1$ and the DFT calculations for the following amino acid residues are performed. Thus, the DFT calculations are performed for the 1-st amino acid residue to the 7-th amino acid residue, the 6-th amino acid residue to the 14-th amino acid residue, the 13-th amino acid residue to the 19-th amino acid residue, the 18-th amino acid residue to the 24-th amino acid residue, and the 22-th amino acid residue to the 72-th amino acid residue on a 9 residues-by-9 residues basis, and for the 71-th amino acid residue to the 80-th amino acid residue, the 80-th amino acid residue to the 86-th amino acid residue, the 85-th amino acid residue to the 95-th amino acid residue, and the 94-th amino acid residue to the 104-th amino acid residue.

5) Creation of the QCLOs of the fragments.

Figure 13:
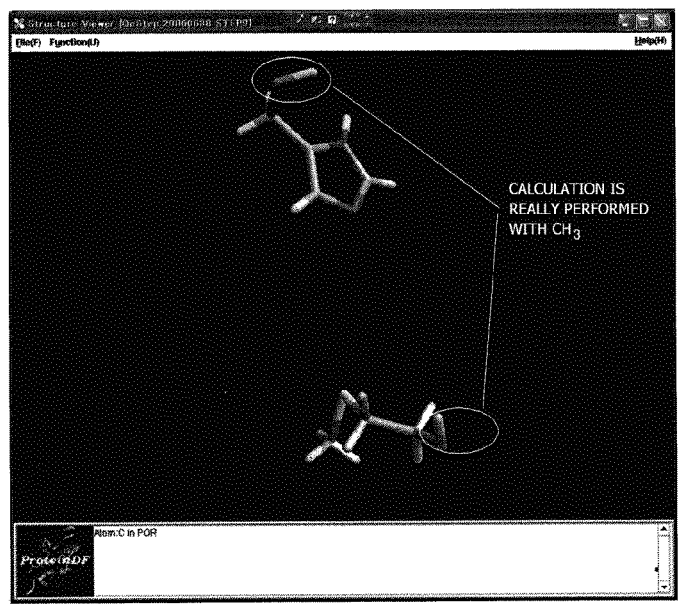
FIG. 13 is a schematic view showing a model molecule of His18 and Met80.

6) Entering in calculation for hetero molecules. Firstly, the DFT calculations for model molecules of His (histidine) 18 and Met (methionine) 80 are performed to create the QCLOs (refer to FIG. 13).

Figure 14:
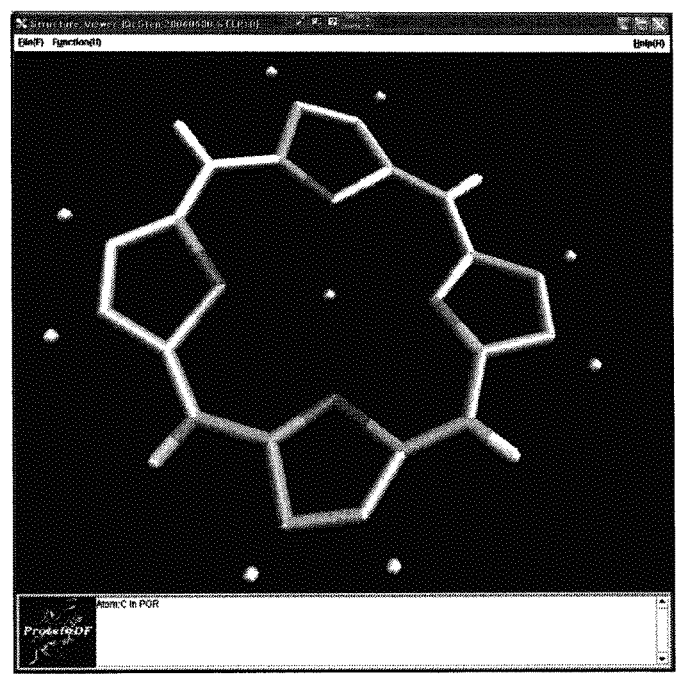
FIG. 14 is a schematic view showing a zinc porphyrin model.

7) Zinc and the porphyrin skeleton are taken out from the structure created in the first place, and the DFT calculation is performed with the structure in which eight hydrogen atoms are added thereto (refer to FIG. 14).

8) Creation of the QCLOs. In this case, a fragment definition of the QCLO is partitively performed for zinc, porphyrin (Por), and HS. A side-chain will be bonded to the H8 portion later.

Figure 15:
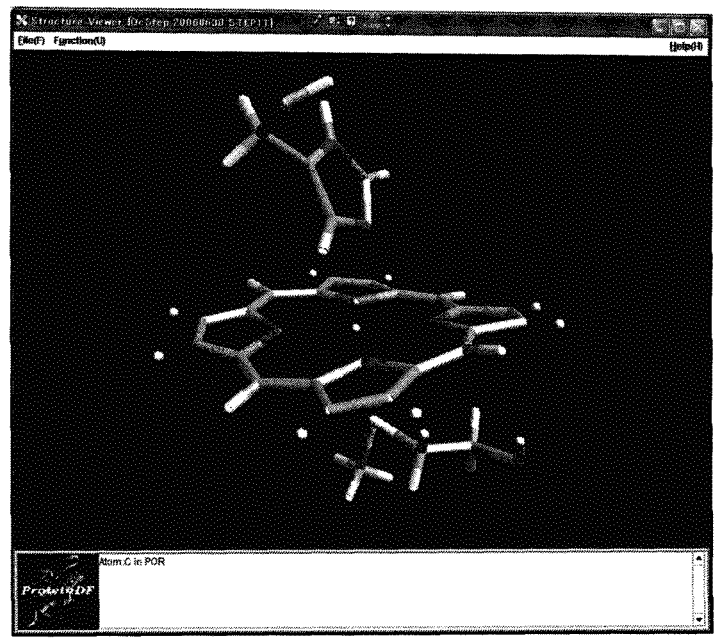
FIG. 15 is a schematic view showing a zinc porphyrin extended model.

9) DFT calculation with the structure obtained by combining Step 7) and Step 6) With each other. The initial MO is obtained by utilizing the QCLO created in Step 6) and Step 8) (refer to FIG. 15).

Figure 16:
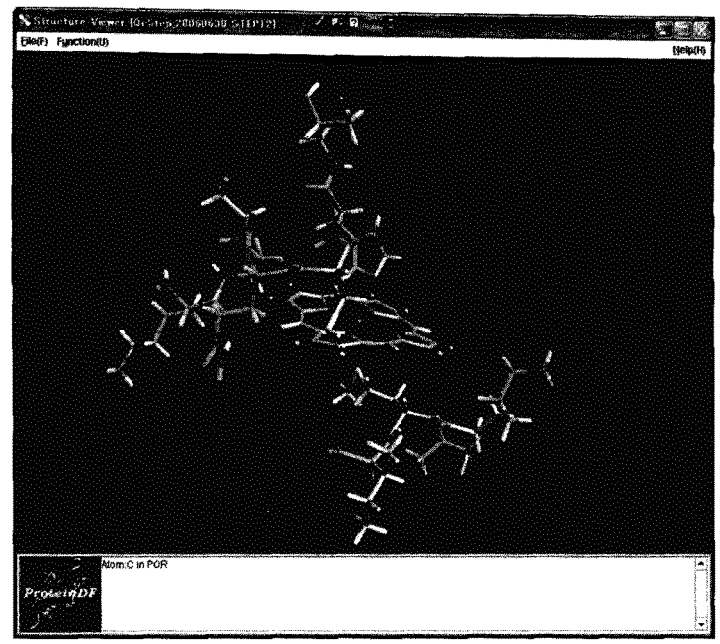
FIG. 16 is a schematic view showing a zinc porphyrin extended model 2.

Zinc and the porphyrin skeleton are taken out from the structure created in the first place, and a structure is obtained in which the amino acid residues from 13-th one to 19-th one and from 78-th one to 81-th one are added to the structure obtained by adding thereto eight hydrogen atoms. Also, each of the QCLOs previously created is set as an initial MO, and in this state, the DFT calculation is performed with respect to the resulting structure (refer to FIG. 16).

Figure 17:
FIG. 17 is a schematic view showing a side-chain model molecule of zinc porphyrin.
Figure 18:
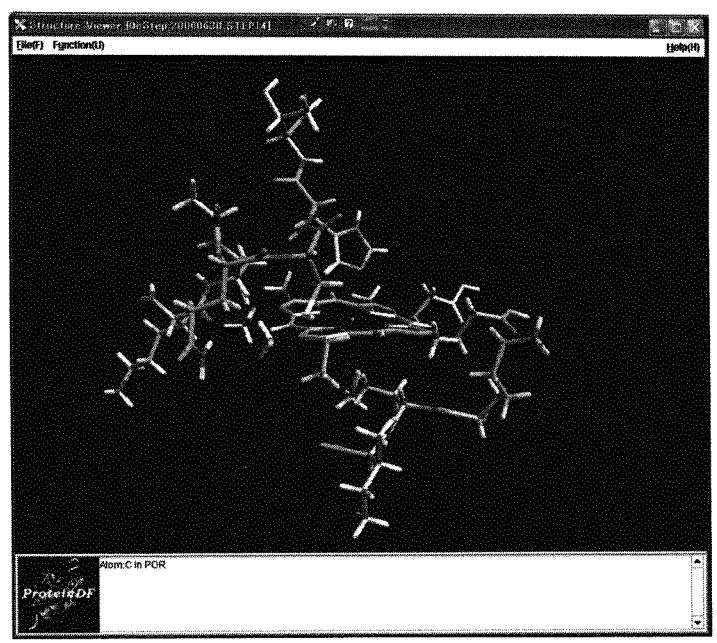
FIG. 18 is a schematic view showing a zinc porphyrin extended model 3.

11) DFT calculations with the side-chain portions of porphyrin as parts. In this case, all the bonds are capped with a methyl group. During the QCLO calculation, a cap methyl group is separated. A treatment for replacing the side-chains of the amino acids with the parts calculated this time in this stage is performed for the portions corresponding to Cys14 and Cys17, respectively (refer to FIG. 17).

12) DFT calculation with respect to zinc and the porphyrin skeleton, a structure having the porphyrin side-chain added to zinc and the porphyrin skeleton, and a structure having the amino acid residues from 13-th one to 19-th one, and from 79-th one to 81-th one added to the structure. At this time, the calculation is performed with S—H hydrogen of Cys14 and Cys17 being removed. The QCLO until the preceding stage is used as the initial MO.

13) A DFT calculation for zinc cytochrome c itself. The QCLO until the preceding stage is used as the initial MO.

Figure 19:
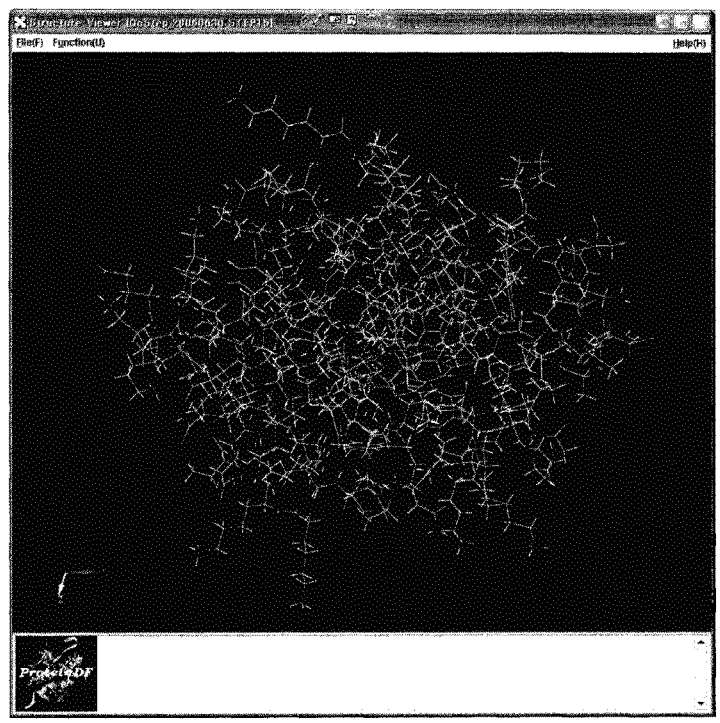
FIG. 19 is a schematic view showing an entire structure of zinc cytochrome c finally calculated.

FIG. 19 shows the entire structure of zinc cytochrome c finally calculated.

<Calculation Conditions>

Functional: VWN~

Base function: DFT type function

H="O-HYDROGEN(41)DZVPP"

C="O-CARBON(621/41) by FS"

N="O-NITROGEN(621/41) by FS"

O="O-OXYGEN(621/41) by FS"

S="O-SULFUR(6321/521/1*)"

Auxiliary base function (coulomb): DFT type function

H="A-HYDROGEN(4, 1; 4, 1) from deMon"

C="A-CARBON(7/2; 7/2) by FS"

N="A-NITROGEN(7/2; 7/2) by FS"

O="A-OXYGEN(7/2; 7/2) by FS"

S="A-SULFUR (5, 4; 5 4)"

Auxiliary base function (exchange correlation): DFT type function

H="A-HYDROGEN(4, 1; 4, 1) from deMon"

C="A-CARBON(7/2; 7/2) by FS"

N="A-NITROGEN(7/2; 7/2) by FS"

O="A-OXYGEN(7/2; 7/2) by FS"

S="A-SULFUR(5, 4; 5, 4)"

<Results>

Figure 20:
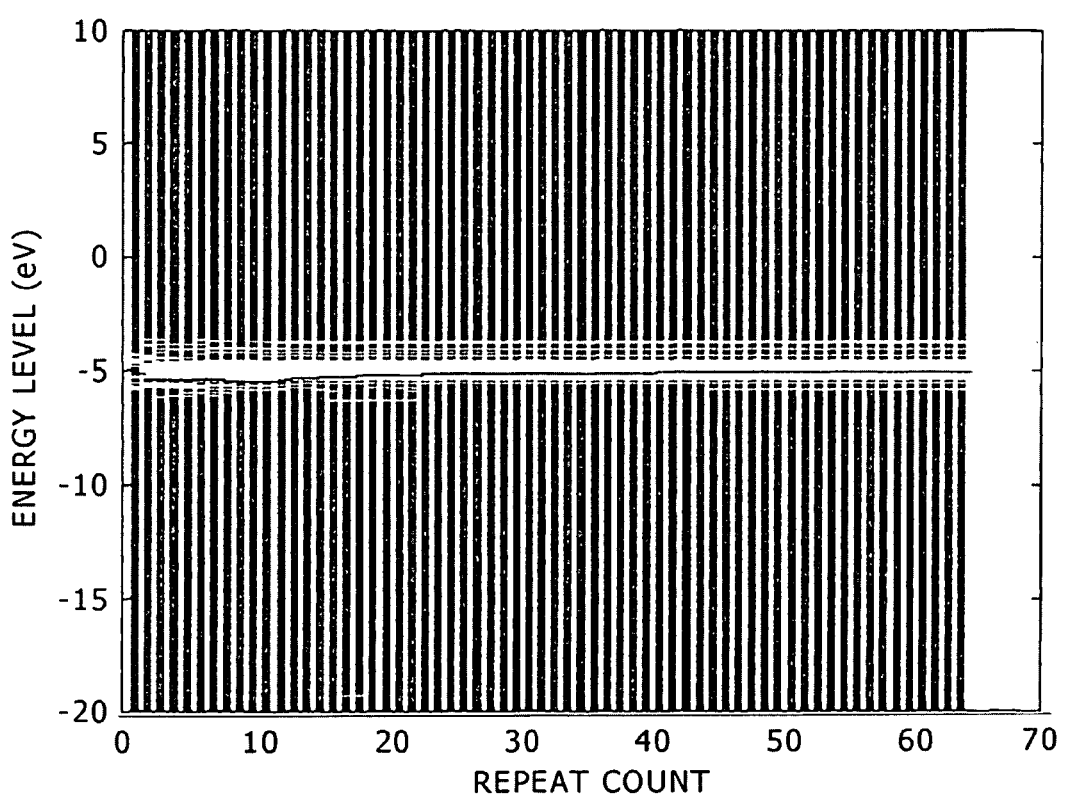
FIG. 20 is a schematic view showing molecular orbital energies of zinc cytochrome c.
Figure 21:
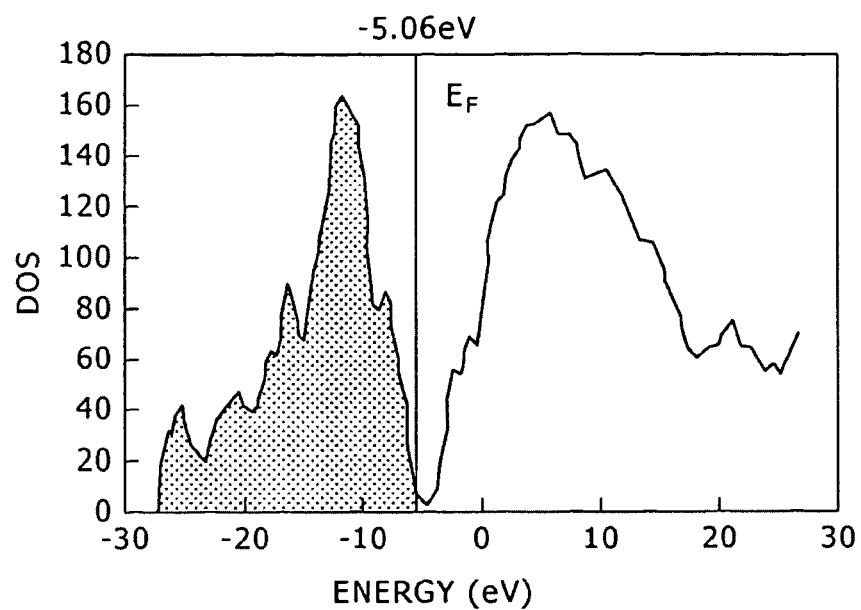
FIG. 21 is a graph showing a density of states of zinc cytochrome c.

FIG. 20 shows an energy diagram of the molecular orbitals of zinc cytochrome c. In the figures, the axis of abscissa represents the number of times of interactive calculation by utilizing a self-consistent field (SCF) approach, and the axis of ordinate represents the energy, of the molecular orbital. In this case, the connected lines represent the energy levels of the HOMOs. FIG. 20 is an appropriate MO diagram because an HOMO-LUMO gap is 0.6 eV and a band gap is in the range of about two to about three eV. The narrowness of the HOMO-LUMO gap obtained in the apo-body is solved by adding the hetero molecule. FIG. 21 is Figure which is obtained by redrawing FIG. 20 in the form of density of states (DOS). In the figure, a peak portion on a low energy side with respect to the Fermi energy $E_F$ corresponds to a valence band stated in a solid state physics. On the other hand, a portion on a high energy side with respect to the Fermi energy $E_F$ corresponds to a conduction band stated therein.

<Search for Molecular Orbitals Involved in Excited State>

Figure 22:
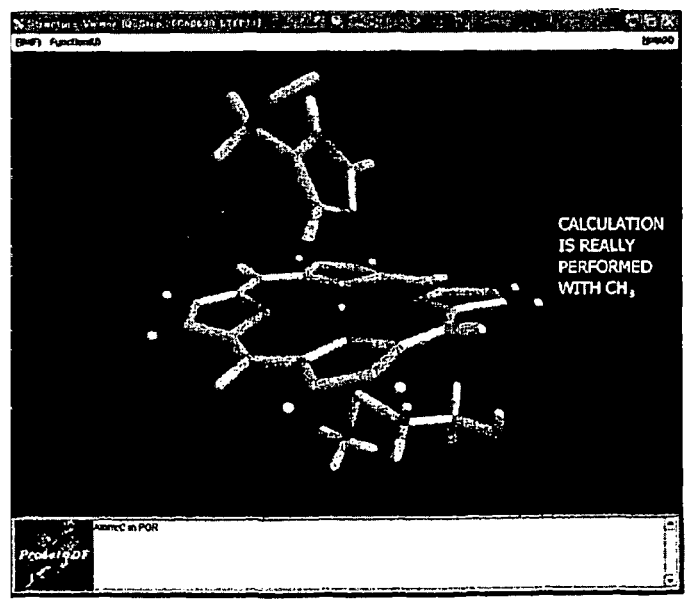
FIG. 22 is a graph showing a model molecule used in calculation of an excited state.

Although the orbital involved in the excited state is made clear when the excited state calculation is performed, the excited state calculation for the protein is an outright fantasy at this moment. So, there is nothing to be done but perform the excited state calculations for the model molecules, thereby inferring the orbital related to the excited state of zinc cytochrome c from the excited state calculations. Fortunately, it is obvious from the shape of the UV-Vis spectrum, and other various studies that the excited state in the visible light region originates in the zinc porphyrin portion. For this reason, the model molecule of zinc porphyrin is enough to investigate the excited state while we desire to know. In addition, with regard to the excited state of the porphyrin class, the enormous studies have been made in past years, and thus almost the natures thereof are previously found out. From these reasons, the excited state calculation is performed herein with a structure shown in FIG. 22. With respect to the theory, the calculation for a singlet excited state is performed by utilizing a time-dependent density functional formalism using the same functional and the same base function because of utilization of the density functional formalism theory using the VWN~functional in the ProteinDF. TABLE 1 shows the calculation results. The calculation is performed by using Gaussian03.

TABLE 1

TDDFT (singlet) calculation for ZnCytc model molecule

| | | |
|---|---|---|
| Excited State 1: | Singlet-A 1.3386 eV 926.21 nm | |
| 146 −> 147 | 0.69240  f = 0.0001 | |
| Excited State 2: | Singlet-A 1.4403 eV 860.79 nm | |
| 146 −> 148 | 0.68673  f = 0.0001 | |
| Excited State 3: | Singlet-A 1.4722 eV 842.17 nm | ⎫ |
| 144 −> 147 | 0.27631  f = 0.0026 | ⎪ |
| 145 −> 147 | 0.63679 | ⎬ Q |
| Excited State 4: | Singlet-A 1.5873 eV 781.11 nm | ⎪ |
| 144 −> 148 | 0.38815  f = 0.0016 | ⎪ |
| 145 −> 148 | 0.57902 | ⎭ |
| Excited State 5: | Singlet-A 1.7971 eV 689.91 nm | ⎫ |
| 142 −> 147 | 0.16564  f = 0.0110 | ⎪ |
| 143 −> 148 | 0.14951 | ⎪ |
| 144 −> 147 | 0.60030 | ⎬ Soret |
| 145 −> 147 | −0.20503 | ⎪ |
| Excited State 6: | Singlet-A 2.0860 eV 594.36 nm | ⎪ |
| 143 −> 147 | −0.28514  f = 0.0094 | ⎪ |
| 144 −> 148 | 0.49562 | ⎪ |
| 145 −> 148 | −0.26731 | ⎭ |

It is confirmed that there is no state having a large value in Nstates=7, 8, 9, 10.

From the calculation results shown in TABLE 1, it is found out that each of excited states 3 and 4 corresponds to the Q band, and each of excited states 5 and 6 corresponds to the Soret band. It is well understood from TABLE 1 that the four molecular orbitals stated in the 4-orbital model of Gonterman are 144, 145, 147, and 148. FIG. 23 is a plan view showing these four molecular orbitals. Also, FIG. 24 is a side view showing the molecular orbitals 144 and 145.

From the foregoing, it is found out that of the four orbitals, the occupied orbital is large and thus a p orbital of methionine S and a d orbital of zinc form a hybridized orbital. This is the large feature and suggests that when zinc porphyrin which has no axial ligand in the normal complex has an axial ligand, it largely changes the nature of a porphyrin π orbital. This result is interesting because it is very similar to a hybridization state of Fe—S (Cys) bond in P450 (refer to a literature of Miyahara, T. et al.: J. Phys. Chem. B2001, 105, 7341 to 7352). In addition, during the photoexcitation, a phenomenon of the divergence of axial ligand is confirmed on an experimental basis. This phenomenon can also be readily explained if the electrons are excited from those orbitals (refer to a literature of Lamp-Pastirk, S. et al.: J. Phys. Chem. B2004, 108, 12602 to 12607).

<Electron States of Zinc Cytochrome c>

Figure 25:
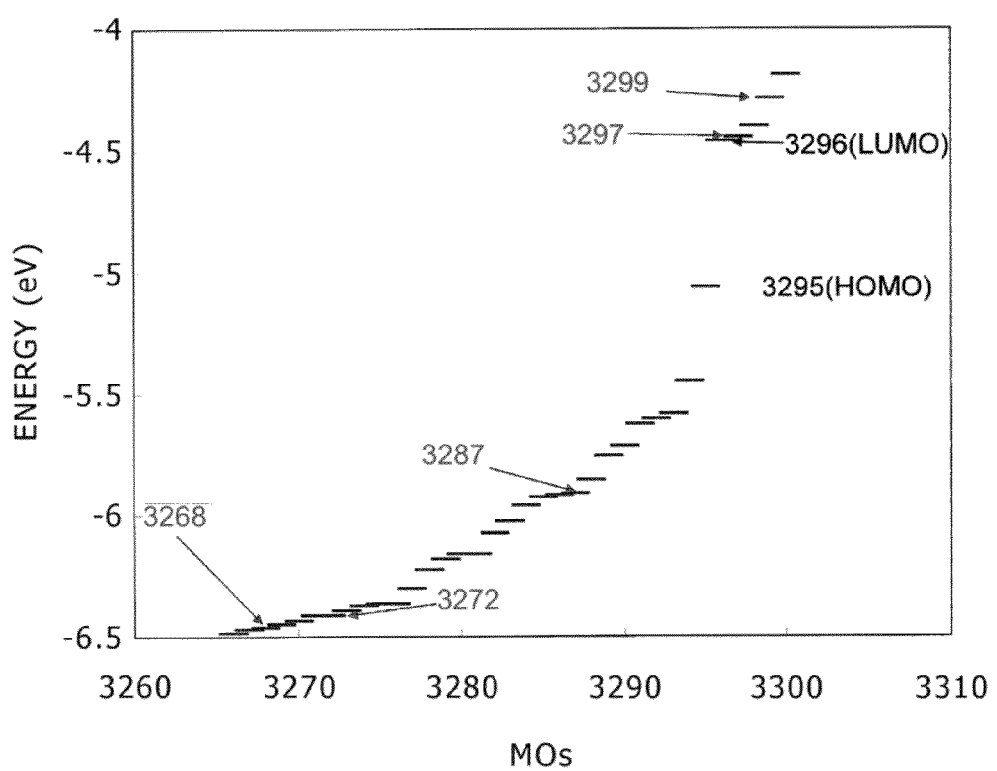
FIG. 25 is a graph showing molecular orbital energies of zinc cytochrome c near a Fermi level, and equipollent surfaces of molecular orbitals getting involved in photoexcitation.

The shape of the molecular orbital involved in the photoexcitation becomes apparent from the above excited state calculation performed for the model molecule of zinc porphyrin. So, next, the orbital involved in the photoexcitation is extracted from the actual molecular orbital of zinc cytochrome c. Also, it is examined with what energy and other molecular orbitals are correlated to the extracted orbital. FIG. 25 is a graphical representation showing a relationship between the energies of the molecular orbitals close to the Fermi level, and the molecular orbitals thought to be involved in the photoexcitation. Also, TABLE 2 shows the summarized results.

TABLE 2

Molecular orbital energy and nature of ZnCytc

| MOs | Energy (eV) | Nature |
|---|---|---|
| 3268 | −6.46 | Porπ, Zn—Sπ |
| 3269 | −6.45 | Glu69 |
| 3270 | −6.44 | Lys7 |
| 3271 | −6.42 | Asn54, Porπ |
| 3272 | −6.42 | Porπ, Zn—Sπ |
| 3273 | −6.39 | Ala83 |
| 3274 | −6.37 | Gly23, His33 |
| 3275 | −6.37 | Gly37, Arg38 |
| 3276 | −6.36 | Gly23, His33 |
| 3277 | −6.30 | Gln12 |
| 3278 | −6.23 | Porπ |
| 3279 | −6.19 | Gln12 |
| 3280 | −6.16 | Arg38 |
| 3281 | −6.16 | His33 |
| 3282 | −6.08 | Ala83 |
| 3283 | −6.03 | Porσ |
| 3284 | −5.97 | Gln12 |
| 3285 | −5.93 | Glu69 |
| 3286 | −5.92 | Gly37 |
| 3287 | −5.92 | Porπ |
| 3288 | −5.86 | Gln16 |
| 3289 | −5.76 | Gln16 |
| 3290 | −5.72 | Thr58 |
| 3291 | −5.63 | Cys17 |
| 3292 | −5.60 | Ala15 |
| 3293 | −5.58 | Lys100 |
| 3294 | −5.45 | Glu69 |
| 3295(HOMO) | −5.06 | Gln16 |
| 3296(LUMO) | −4.46 | Glu62 |
| 3297 | −4.45 | Porπ* |
| 3298 | −4.40 | Asp93 |
| 3299 | −4.29 | Porπ* |

When looking at the results shown in TABLE 2, it is understood that each of the occupied orbitals involved in the photoexcitation is located in a considerably deeper energy level than the Fermi level (HOMO). On the other hand, it is found out that the unoccupied orbital side is located in a relatively low energy level.

<Theoretical Consideration about Bidirectional Photocurrent in Zinc Cytochrome c Electrode>

The fact that the photosensitized current is caused to flow bidirectionally means that a path exists which the excited electrons is caused to flow not only into the electrode side, but also into the bulk side, and a path also exists which the holes are caused to flow not only into the electrode side, but also into the bulk side. In order to verify whether or not such paths actually exist, the consideration is advanced while comparing the equipollent surface views of the molecular orbitals with the energies. FIGS. 26 to 28 respectively show the equipollent surface views of the molecular orbitals (−0.0005, 0.0005) used in the consideration.

Figure 29:
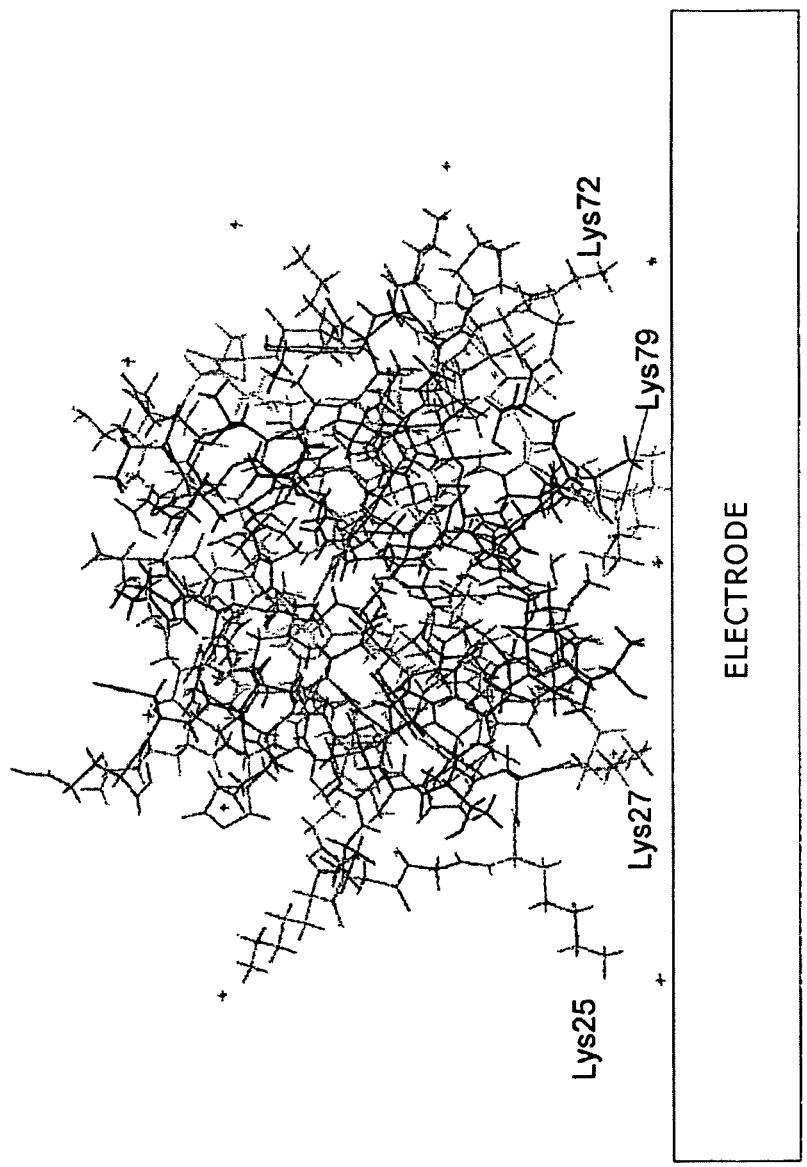
FIG. 29 is a schematic view showing a state of adsorption of zinc cytochrome c to an electrode.

Firstly, it is necessary to consider a direction when zinc cytochrome c is adsorbed on the gold electrode. The study about this has been advanced from a viewpoint of both the recent experiments and theory, so that the adsorption state becomes apparent (study in iron cytochrome c) (refer to a literature of Li, L. et al.: Electroanalysis, 2004, 16, 81-87). FIG. 29 shows the adsorption state of zinc cytochrome c to a golden electrode.

Figure 30:
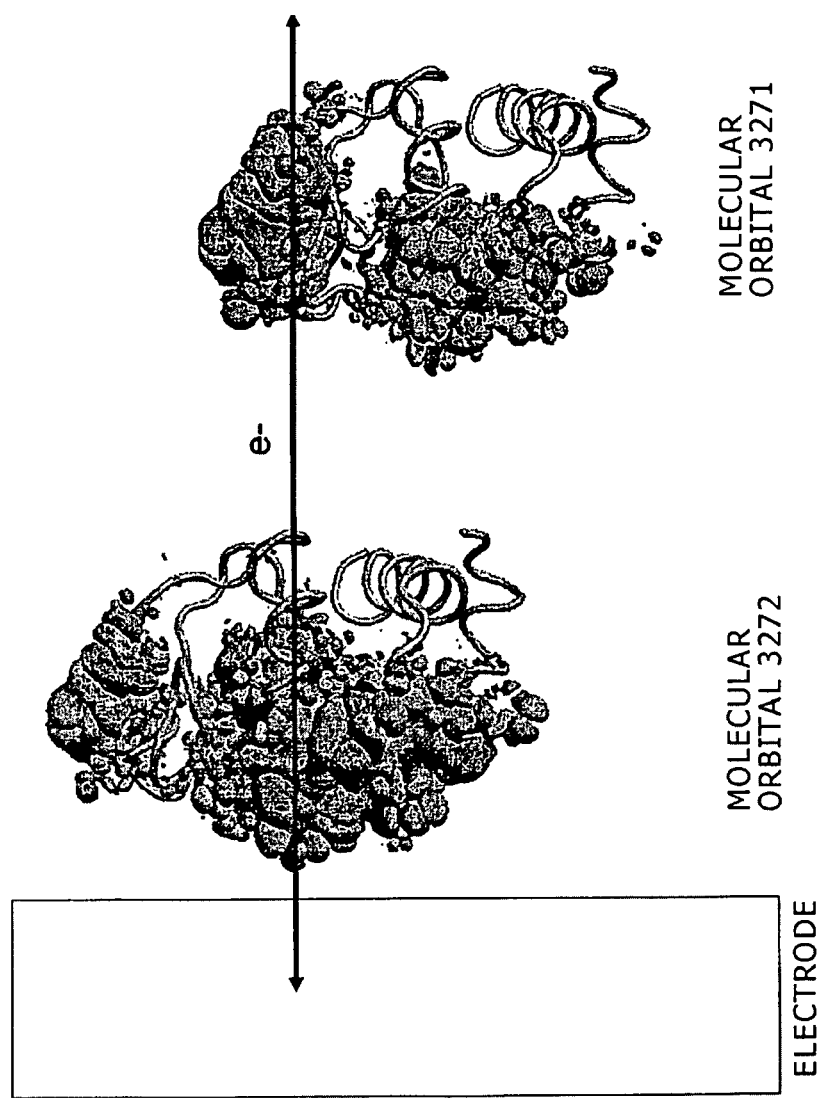
FIG. 30 is a schematic view showing a transfer path of a hole generated by photoexcitation of zinc cytochrome c on the electrode.
Figure 31:
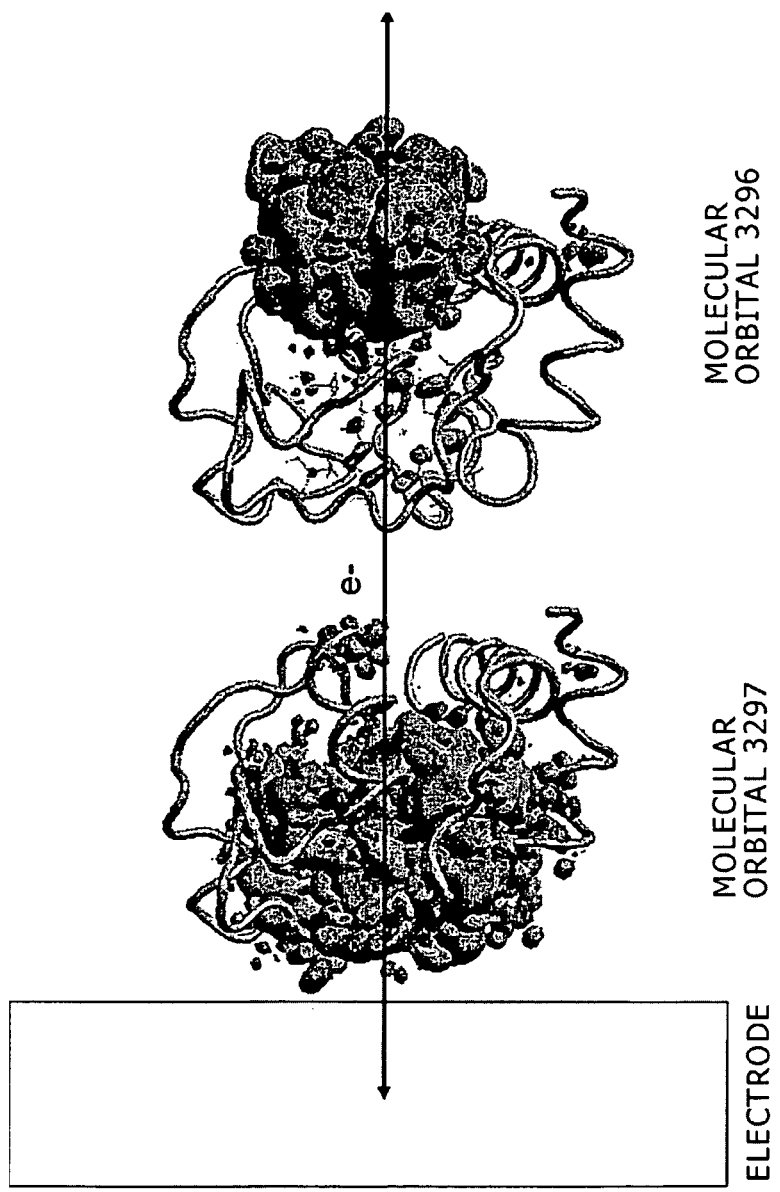
FIG. 31 is a schematic view showing a transfer path of an electron generated by the photoexcitation of zinc cytochrome c.

When looking at FIG. 29, zinc porphyrin is directed to an electrode, and thus it can be imagined that the entering of the excited electrons into the electrode readily occurs. However, how the outflow of the electrons into the bulk occurs? In order to cause the electrons to flow into the bulk side, it is necessary to couple the path to the molecular orbital protruding to the bulk side, or to form the path to the bulk side owing to the large extent of the molecular orbital itself excited. In addition, this also applies to the holes. When looking at FIG. 25, each of the molecular orbitals involved in the photoexcitation on the occupied orbital side is located at the deep energy level, and many orbitals capable of being coupled to the molecular orbital exist in the positions close to one another in energy. In a word, even if the holes are excited in a heme near the electrode, or even if the path can be formed through which the holes are carried to the bulk via the orbitals near each other in energy, it will not be surprised. When actually looking at the molecular orbitals, it is found out that the orbital exists which protrudes to the bulk so as to be coupled to zinc porphyrin (MO3271: Asu54+porπ. Refer to FIG. 30).

From the calculation performed this time, in addition thereto, it becomes clear that there is a large difference between the molecular orbital having zinc porphyrin hybridized with its extent and the molecular orbital not having zinc porphyrin hybridized with its extent (refer to FIGS. 26 to 28). In the case of the molecular orbital hybridized with zinc porphyrin, although it is unclear whether or not the d orbital of zinc exerts an influence thereon, it is found out that the influence of the molecular orbital is exerted on a position faraway therefrom in the form of taking in the peripheral molecular orbitals of the amino acid. On the other hand, in the case of the molecular orbital not involving zinc porphyrin, it is found out that the orbital is localized on the amino acid residue, and thus the amino acid residue has the nature as the insulating amino acid. This means that when the transition metal is added to the protein, the resulting protein has the feature that the molecular orbital extends in the form of involving the amino acid. This agrees with the fact that the electron transfer can be artificially caused as long as myoglobin or the like has zinc porphyrin although not being the electron transfer protein (refer to a literature of Willner, I. & Katz, E.: "Bioelectronics" Wiley-VCH (Weinheim), 2005).

The knowledge obtained from the foregoing are summarized as follows.

1) The first-principle calculation (all electron calculation) for zinc cytochrome c is performed to be successful in determining the electron state in the ground state.

2) The excitation state calculation for zinc porphyrin results in meeting with success in attribution of the molecular orbitals in zinc cytochrome c involved in the photocurrent. It is suggested that the reason for causing the photocurrent to bidirectionally flow is because the occupied orbital and the unoccupied orbital which are involved in causing the photocurrent to bidirectionally flow are coupled to the orbitals each protruding to the bulk, respectively.

The examination is further performed based on the knowledge described above. From the knowledge about the coupling between the molecular orbitals in zinc cytochrome c, it is understood that it is possible, for example, that the transfer of the electrons from a certain amino acid residue to another amino acid residue of zinc cytochrome c, the transfer of the electrons from zinc porphyrin and an amino acid residue of zinc cytochrome c to another amino acid residue thereof, and the transfer of the electrons from zinc porphyrin of zinc cytochrome c to another amino acid residue thereof. For example, when the electron of the molecular orbit localized in a certain amino acid residue is excited to transit therefrom to another molecular orbital localized in another amino acid residue, the electron is regarded as being transferred from the certain amino acid residue to the another amino acid residue within zinc cytochrome c. In addition, when the electron of the molecular orbital localized in each of zinc porphyrin and an amino acid residue of zinc cytochrome c is excited to transit thereform to another molecular orbital localized in another amino acid residue, the electron is regarded as being transferred from each of zinc porphyrin and the amino acid residue to the another amino acid residue within zinc cytochrome c.

Figure 32:
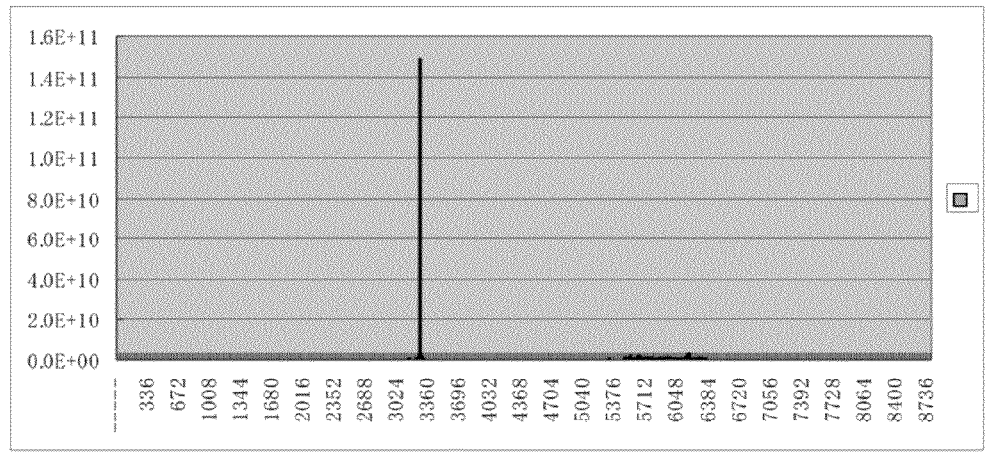
FIG. 32 is a spectral diagram showing a transition probability of electron transition between an MO3272 and another molecular orbital of zinc cytochrome c.
Figure 33:
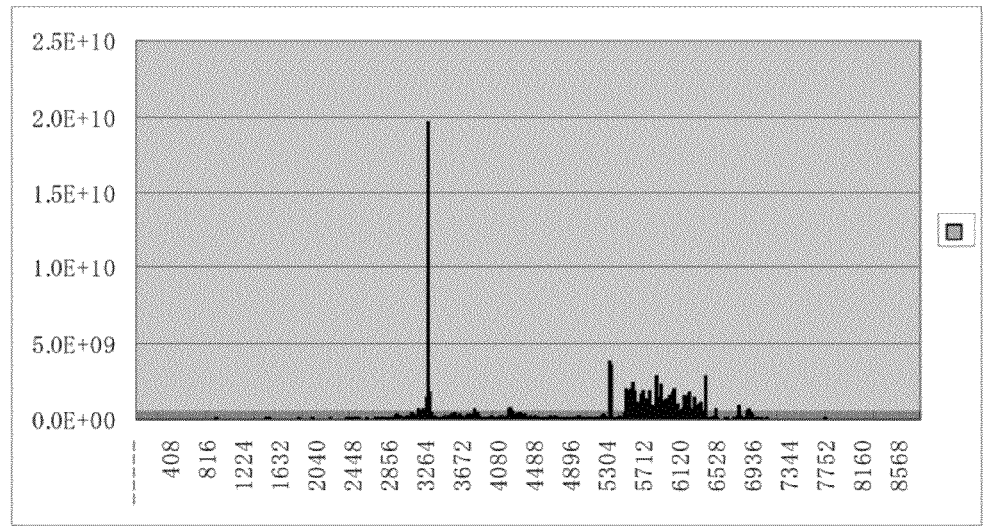
FIG. 33 is a spectral diagram showing a transition probability of electron transition between an MO3268 and another molecular orbital of zinc cytochrome c.
Figure 34:
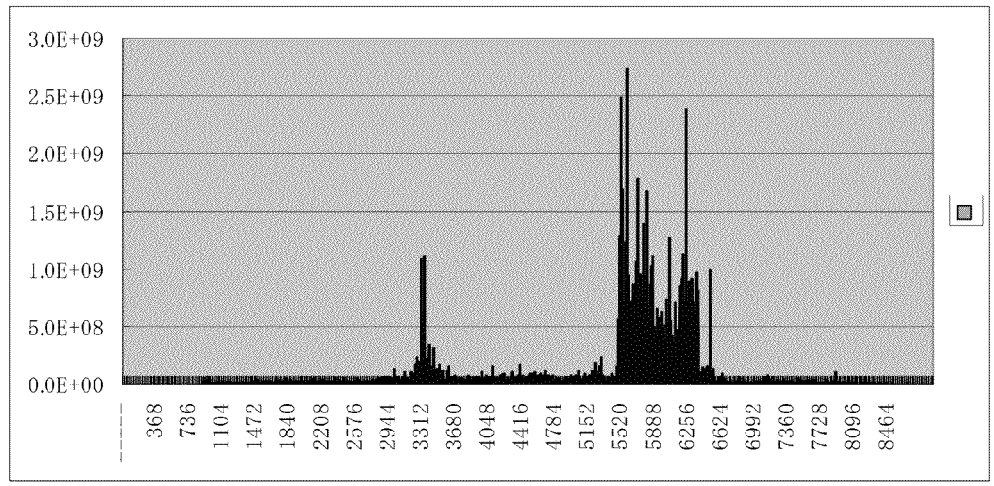
FIG. 34 is a spectral diagram showing a transition probability of electron transition between an MO3297 and another molecular orbital of zinc cytochrome c.
Figure 35:
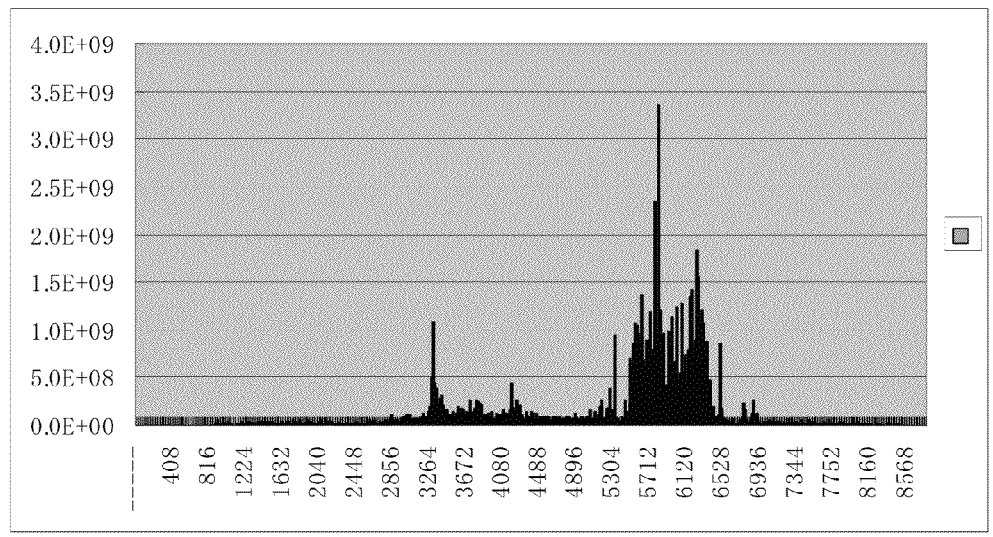
FIG. 35 is a spectral diagram showing a transition probability of electron transition between an MO3299 and another molecular orbital of zinc cytochrome c.

In this case, the velocity of the electron transfer following the transition between the molecular orbitals, as previously stated, is described in Expressions (1) and (2). By calculating a second tern and a third term on the assumption that the Frank-Condon term as the first term in Expression (2) has a maximum value of one, $k_{ET}$ is obtained. The calculation results are shown in FIGS. 32 to 35. In these figures, the axis of abscissa represents a number of the molecular orbital, and the axis of ordinate represents $k_{ET}$. Referring now to FIG. 32, for the molecular orbital 3272 (the porphyrin π orbital and the Zn—Sπ orbital), $k_{ET}$ becomes maximum due to the coupling between the molecular orbital 3271 (an Asn54 and the porphyrin π orbital) and the molecular orbital 3272, and its maximum value is $5 \times 10^{11}$ sec$^{-1}$. Referring to FIG. 33, for the molecular orbital 3268 (the porphyrin π orbital and the Zn—Sπ orbital), $k_{ET}$ becomes maximum due to the coupling with the molecular orbital 3270 (localized in Lys7), and its maximum value is $2.0 \times 10^{10}$ sec$^{-1}$. Referring to FIG. 34, for the molecular orbital 3297 (the prophyrin π*orbital), $k_{ET}$ becomes maximum due to the coupling with the molecular orbital 3296 (localized in Glu62), and its maximum value is $5.5 \times 10^8$ sec$^{-1}$. It is noted that although as apparent from FIG. 34, the molecular orbitals each having $k_{ET}$ higher than $5.5 \times 10^8$ sec$^{-1}$ also exist, each of the energies of these molecular orbitals is remarkably high, and thus cannot be practically involved in the photoexcitation. Also, referring to FIG. 35, for the molecular orbital 3299 (the prophyrin π*orbital), $k_{ET}$ becomes maximum due to the coupling with the molecular orbital 3296 (localized in Glu62), and its maximum value is $8 \times 10^8$ sec$^{-1}$. It is noted that although as apparent from FIG. 35, the molecular orbitals each having $k_{ET}$ higher than $2.8 \times 10^8$ sec$^{-1}$ also exist, each of the energies of these molecular orbitals is remarkably high, and thus cannot be practically involved in the photoexcitation.

From FIGS. 32 to 35, it is understood that the electron transfer occurs within zinc cytochrome c along with the transition between a certain molecular orbit and the molecular orbit having the maximum $k_{ET}$. That is to say, of the molecular orbitals between corresponding ones of which the electron can actually transit, the electron transits between a certain molecular orbital and the molecular orbit having the maximum $k_{ET}$. Also, occurrence of the transition of the electron between the certain molecular orbital and the molecular orbital having the maximum $k_{ET}$ results in that either the electron or the hole is transferred between the portions in which these molecular orbitals are localized, respectively, within zinc cytochrome c.

Various devices can be realized by utilizing the transfer, of either the electron or the hole within zinc cytochrome, following the transition between the molecular orbitals owing to the photoexcitation which has been described so far.

Figure 36:
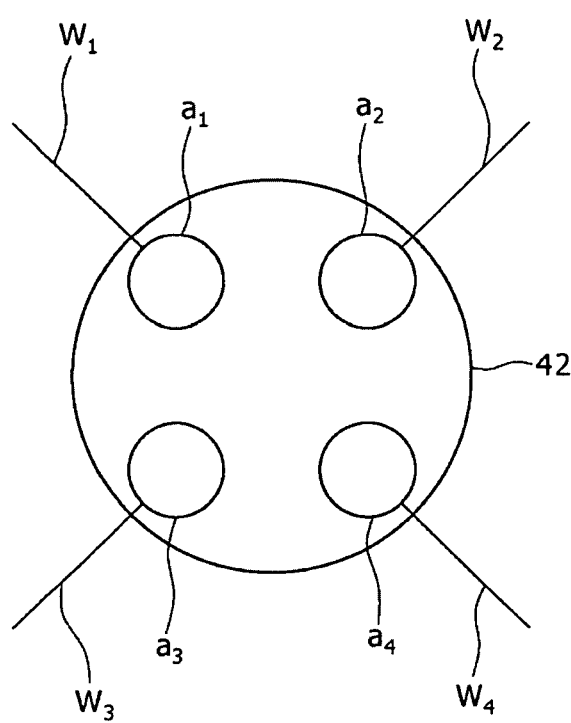
FIG. 36 is a schematic view showing a single-molecular optical switch according to a first embodiment.

FIG. 36 shows a single-molecular optical switch according to a first embodiment of the present application.

As shown in FIG. 36, in this single-molecular optical switch wires $w_1$ to $w_4$ are connected to four amino acid residues $a_1$ to $a_4$ of one molecule of zinc cytochrome c 42, respectively. In this case, the transfer of either the electron or the hole following the transition between the molecular orbitals owing to the photoexcitation is adapted to occur between the amino acid residues $a_1$ and $a_4$, and between the amino acid residues $a_2$ and $a_3$ in these amino acid residues $a_1$ to $a_4$. That is to say, the molecular orbitals are localized in the amino acid residues $a_1$ and $a_4$, respectively. Also, in contrast to one of the molecular orbitals, the other becomes a molecular orbital having the maximum $k_{ET}$. Likewise, the molecular orbitals are localized in the amino acid residues $a_2$ and $a_3$ respectively. Also in contrast to one of the molecular orbitals, the other becomes a molecular orbital having the maximum $k_{ET}$.

A description will now be given with respect to a method of operating this single-molecular optical switch.

Firstly, for example, a light having a wavelength $\lambda_1$ with which a molecular orbital $MO_1$ localized in the amino acid residue $a_1$ can be selectively, optically excited is radiated to the single-molecular optical switch. As a result, the electron transits between the molecular orbital $MO_1$ and a molecular orbital $MO_4$ localized in the amino acid residue $a_4$. Along with this transition, either the electron or the hole is transferred between the amino acid residues $a_1$ and $a_4$, and thus conduction is obtained between the wires $w_1$ and $w_4$. At this time, neither the electron nor the hole is transferred between the amino acid residues $a_2$ and $a_3$, and thus non-conduction is obtained between the wires $w_2$ and $w_3$. Next, a light having a wavelength $\lambda_2$ with which a molecular orbital $MO_2$ localized in the amino acid residue $a_2$ can be selectively, optically excited is radiated to the single-molecular optical switch. As a result, the electron transits between the molecular orbital $MO_2$ and a molecular orbital $MO_3$ localized in the amino acid residue $a_3$. With this transition, either the electron or the hole is transferred between the amino acid residues $a_2$ and $a_3$, and thus conduction is obtained between the wires $w_2$ and $w_3$. At this time, neither the electron nor the hole is transferred between the amino acid residues $a_1$ and $a_4$, and thus non-conduction is obtained between the wires $w_1$ and $w_4$.

As described above, according to the first embodiment, a state in which the conduction is obtained between the wires $w_1$ and $w_2$, and a state in which the conduction is obtained between the wires $w_2$ and $w_3$ can be switched over to each other in an instant. The single-molecular optical switch can be very readily manufactured by using zinc cytochrome c without relying on the complicated chemical synthesis method. Also, the superdense integration can be made because the single-molecular optical switch has a size on the order of nanometer, and the ultrahigh-speed switching operation is possible.

Next, a description will now be given with respect to a molecular wire according to a second embodiment of the present application.

Figure 37:
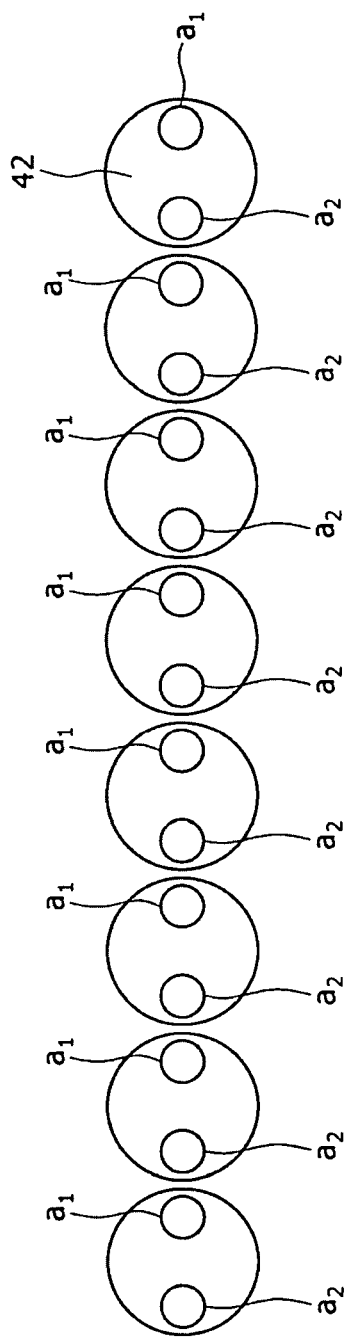
FIG. 37 is a schematic view showing a molecular wire according to a second embodiment.

As shown in FIG. 37, in the molecular wire, plural molecules of zinc cytochrome c 42 are linearly bonded to one another in the saute orientation. In this case, the transfer of either the electron or the hole following the transition between the molecular orbitals owing to the photoexcitation is adapted to occur between amino acid residues $a_1$ and $a_2$ of each of the plural molecules of zinc cytochrome c 42. That is to say, the molecular orbitals are localized in the amino acid residues $a_1$ and $a_2$, respectively. Thus, in contrast to one of these molecular orbitals, the other is a molecular orbital having the maximum $k_{ET}$.

A description will be given hereinafter with respect to a method of operating the molecular wire.

Firstly, a light having a wavelength $\lambda_1$ with which a molecular orbital $MO_1$ localized in the amino acid residue $a_1$ can be selectively, optically excited is radiated to the molecular wire. As a result, the electron transits between the molecular orbital $MO_1$ and a molecular orbital $MO_2$ localized in the amino acid residue $a_2$. Along with this transition, either the electron or the hole is transferred between the amino acid residues $a_1$ and $a_2$. Such transfer of either the electron or the hole in each of the plural molecules of zinc cytochrome c 42 results in that a current is caused to flow between opposite terminals of the molecular wire.

According to the second embodiment, the current can be caused to instantaneously flow between the opposite terminals of the molecular wire by radiation of the light. The molecular wire can be very readily manufactured by using zinc cytochrome c without relying on the complicated chemical synthesis method. Also, the superdense Pairing can be made because the molecular wire has a size on the order of nanometers.

Next, a description will now be given with respect to a molecular wire according to a third embodiment of the present application.

Figure 38:
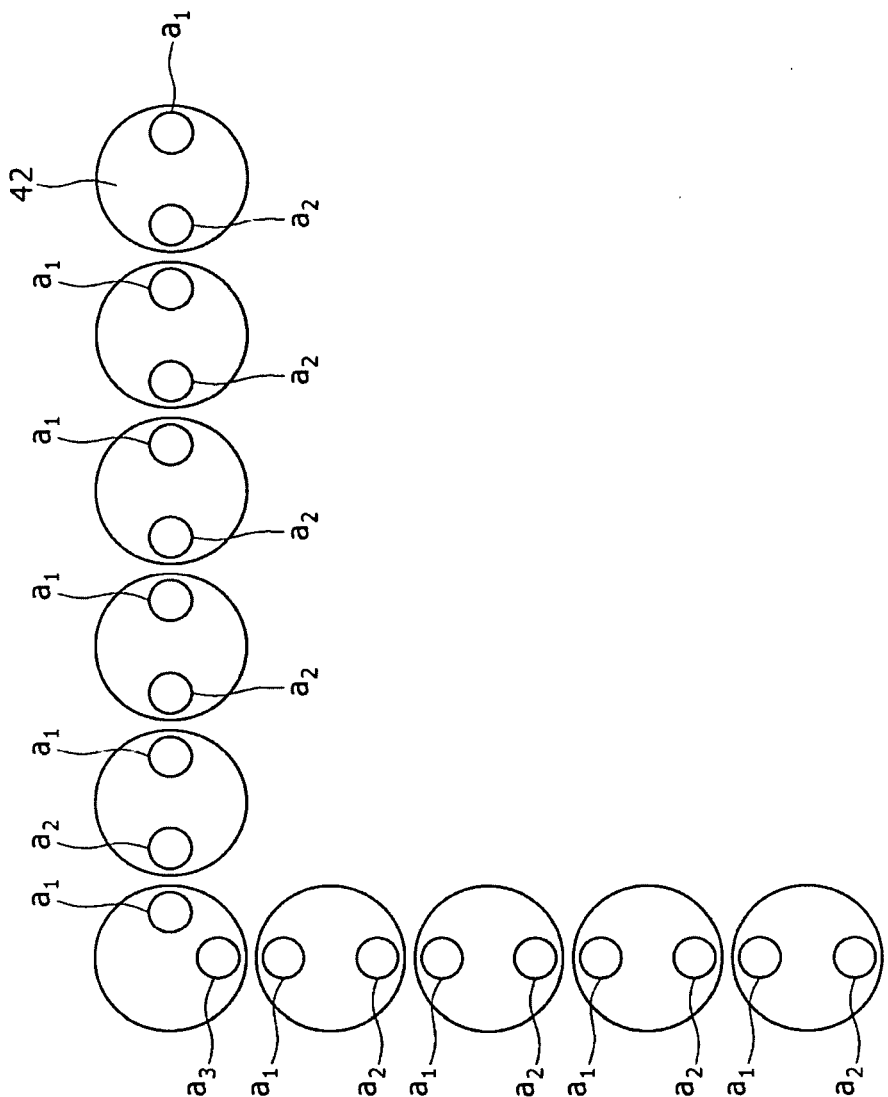
FIG. 38 is a schematic view showing a molecular wire according to a third embodiment.

As shown in FIG. 38, in the molecular wire, plural molecules of zinc cytochrome c 42 are bonded to one another so as to have an L-like shape. In this case, the transfer of either the electron or the hole following the transition between the molecular orbitals owing to the photoexcitation is adapted to occur between amino acid residues $a_1$ and $a_2$ of each of the plural molecules of zinc cytochrome c 42 in straight line portions of the L-like molecular wire. That is to say, the molecular orbitals are localized in the amino acid residues $a_1$ and $a_2$, respectively. Thus, in contrast to one of these molecular orbitals, the other is a molecular orbital having the maximum $k_{ET}$. On the other hand, in the L-like bending portion of the molecular wire, the transfer of either the electron or the hole following the transition between the molecular orbitals owing to the photoexcitation is adapted to occur between amino acid residues $a_1$ and $a_3$ of the one molecule of zinc cytochrome c 42. That is to say, the molecular orbitals are localized in the amino acid residues $a_1$ and $a_3$, respectively. Thus, in contrast to one of these molecular orbitals, the other is a molecular orbital having the maximum $k_{ET}$.

A description will be given hereinafter with respect to a method of operating the molecular wire of the third embodiment.

Firstly, a light having a wavelength $\lambda_1$ with which a molecular orbital $MO_1$ localized in the amino acid residue $a_1$ can be selectively optically excited is radiated to the molecular wire. As a result, the electron transits between the molecular orbital $MO_1$ and a molecular orbital $MO_2$ localized in the amino acid residue $a_2$. With this transition, either the electron or the hole is transferred between the amino acid residues $a_1$ and $a_2$. Either the electron or the hole is transferred in each of the molecules of zinc cytochrome c 42 in the straight line portions of the L-like molecular wire in such a manner. On the other hand, the electron transits between the molecular orbital $MO_1$ and the molecular orbital $MO_3$ localized in the amino acid residue $a_3$ in the L-like bending portion of the L-like molecular wire. With this transition, either the electron or the hole is transferred between the amino acid residue $a_1$ and the amino acid residue $a_3$. As a result, a current is caused to flow between both the terminals of the molecular wire.

According to the third embodiment, in addition to the same advantage as that of the second embodiment, it is also possible to obtain an advantage that the bending-shaped molecular wire can be obtained.

Figure 39:
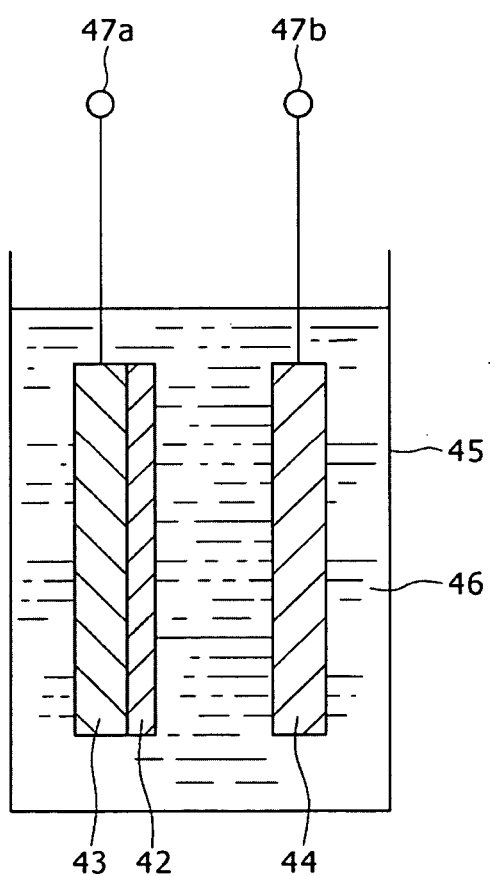
FIG. 39 is a schematic view showing a photoelectric conversion element according to a fourth embodiment.

Next, a description will now be described with reference to a photoelectric conversion element according to a fourth embodiment of the present application. FIG. 39 shows the photoelectric conversion element of the fourth embodiment.

As shown in FIG. 39, in the photoelectric conversion element, a single-molecular film or a multimolecular film made of zinc cytochrome c 42 is immobilized on an electrode 43 made of a conductive material directly or indirectly through an -intermediate layer. Although the electrode 43 is illustrated in FIG. 39 so as to have a flat surface shape, the surface shape of the electrode 43 is arbitrarily set, and thus may be any of a depressed surface, a projected surface, a depressed and projected surface shape, and the like. In this case, the single-molecular film or the multimolecular film made of zinc cytochrome c 42 has an amino acid residue $a_1$ on the electrode 43 side, and an amino acid residue $a_2$ on a side opposite to the electrode 43 side. Thus, the transfer of either the electron or the hole following the transition between the molecular orbitals owing to the photoexcitation is adapted to be performed between the amino residues $a_1$ and $a_2$. That is to say, the molecular orbitals are localized in the amino residues $a_1$ and $a_2$, respectively, and in contrast to one of the molecular orbitals, the other is a molecular orbital having the maximum $k_{ET}$. An electrode 44 made of a conductive material is provided at a distance so as to face the single-molecular film or the multimolecular film made of zinc cytochrome c 42 immobilized on the electrode 43. The electrodes 43 and 44 are immersed in an electrolyte solution 46 put in a vessel 45. An electrolyte solution not impairing the function of zinc cytochrome c 42 is used as the electrolyte solution 46. In addition, the electrolyte in which an oxidation reaction occurs in the electrode 43, and a reduction reaction occurs in the electrode 44, or in which the reduction reaction occurs in the electrode 43, and the oxidation reaction occurs in the electrode 44 is used as one (or, the redox) of the electrolyte solution 46.

In order to perform the photoelectric conversion by using the photoelectric conversion element, a difference between natural electrode potentials which the electrodes 43 and 44 have, respectively, is used as a bias voltage. In this state, a light is radiated to the single-molecular film or the multimolecular film made of zinc cytochrome c 42 immobilized on the electrode 43. The light has a wavelength with which zinc cytochrome c 42 can be optically excited, and is normally a visible light. In this case, adjusting at least one of selection of the materials for the electrodes 43 and 44, and an intensity and a wavelength of the light to be radiated makes it possible to change a magnitude and/or a polarity of a photocurrent which is caused to flow through the inside of the photoelectric conversion element. The photocurrent is taken out to the outside through terminals 47a and 47b.

The conductive materials which are previously given can be used as ones of which the electrodes 43 and 44 are made, respectively, and are suitably selected as may be necessary. Specifically, in order to radiate the light to the entire or approximately entire single-molecular film or multimolecular film made of zinc cytochrome c 42 immobilized on the electrode 43, preferably, at least one of the electrodes 43 and 44 is made of a conductive material which transmits the light (normally, the visible light) used in the photoexcitation of zinc cytochrome c 42, for example, the ITO, the FTO, the Nesa glass or the like.

According to the fourth embodiment, it is possible to realize the novel photoelectric conversion element in which zinc cytochrome c 42 is used as the photoelectric conversion material. According to the photoelectric conversion element, the various applications are possible because adjusting at least one of selection of the materials for the electrodes 43 and 44, and an intensity and a wavelength of the light to be radiated makes it possible to change a magnitude and/or a polarity of a photocurrent which is caused to flow through the inside of the photoelectric conversion element. Zinc cytochrome c 42 is advantageous in manufacture of the photoelectric conversion element because it can be simply synthesized and thus any of the complicated chemical synthesis processes as in the organic semiconductor is unnecessary for the synthesis of zinc cytochrome c 42. In addition, since the surface shape of the electrode 43 can be arbitrarily selected, the degree of freedom in manufacturing the structure of the photoelectric conversion element is high.

Next, a description will now be given with respect to a photodetector according to a fifth embodiment.

Figure 40:
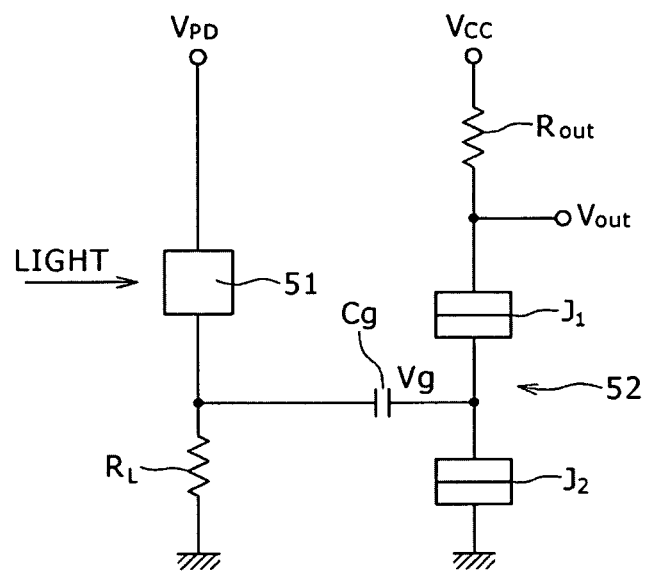
FIG. 40 is a circuit diagram showing a photodetector according to a fifth embodiment.

FIG. 40 is a circuit diagram showing the photodetector of the fifth embodiment. As shown in FIG. 40, the photodetector is composed of a photodiode 51, and a single-electron transistor 52. In this case, the photodiode 51 is constituted by the photoelectric conversion element according to the fourth embodiment of the present application. Also the single-electron transistor 52 amplifies an output signal from the photodiode 51. The single-electron transistor 52 is composed of a minute tunnel junction $J_1$ on a drain side, and a minute tunnel junction $J_2$ on a source side. Capacitances of the minute tunnel junctions J1 and J2 are set as $C_1$ and $C_2$, respectively. For example, the electrode 44 of the photodiode 51 is grounded through a load resistor $R_L$, and the electrode 43 thereof is connected to a positive power source for supplying a positive voltage $V_{PD}$ used to bias the photodiode 52. On the other hand the source of the single-electron transistor 52 is grounded and the drain thereof is connected to a positive power source for supplying a positive voltage $V_{CC}$ through an output resistor $R_{out}$. Also, the electrode 44 of the photodiode 51 and a gate of the single-electron transistor 52 are connected to each other through a capacitor $C_g$.

With the phtodetector configured as described above, when the light is radiated to the photodiode 51, so that the photocurrent is caused to flow, the capacitor $C_g$ is charged with a voltage developed across opposite terminals of the load resistor $R_L$. A gate voltage $V_g$ is applied to the gate of the single-electron transistor 52 through the capacitor $C_g$. Also, a change $\Delta V_g$ in gate voltage $V_g$ is measured by measuring a change $\Delta Q = C_g \Delta V_g$ in amount of charges accumulated in the capacitor $C_g$. Here, the single-electron transistor 52 used to amplify the output signal from the photodiode 51 can measure the change $\Delta Q = C_g \Delta V_g$ in amount of charges accumulated in the capacitor $C_g$ at sensitivity which, for example, is one million times as large as that of the transistor in the related art. That is to say, a resistance value of the load resistor $R_L$ can be reduced because the single-electron transistor 52 can measure the change $\Delta V_g$ in minute gate electrode $V_g$. As a result, it is possible to promote the high sensitivity and the high-speed operation of the photodetector to a large extent. In addition, it is possible to suppress the noise generated on the amplifier circuit side because a thermal noise is suppressed on the single-electron transistor 52 side owing to a charging effect.

Moreover, the single-electron transistor 52 consumes the very less power because it uses the tunnel effect of one electron in its basic operation.

In the photodetector, as previously described above, the photodiode 51 and the single-electron transistor 52 are capacitively-coupled to each other. A voltage gain at this time is given by $C_g/C_1$. Thus the capacitance value of the capacitor $C_1$ of the minute tunnel junction $J_1$ is made sufficiently small, which results in that it is possible to obtain an output voltage $V_{out}$ enough to drive an element connected to a subsequent stage of the photodetector.

Next, a description will now be given with respect to examples of concrete structures of the photodetector of the fifth embodiment.

In each of the examples, the single-electron transistor 52 is constituted by a metal/insulator junction, and the photodiode 51 is constituted by the photoelectric conversion element according to the fourth embodiment of the present application.

Figure 41:
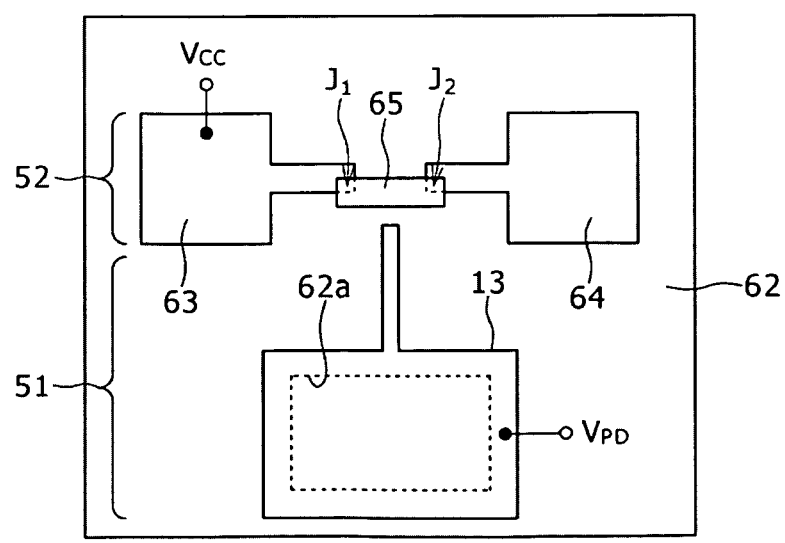
FIG. 41 is a plan view showing a structural example of the photodetector according to the fifth embodiment.

FIG. 41 is a plan view of the photodetector. In addition, FIG. 42 is a cross sectional view of the photodiode 51 portion of the photodetector, and FIG. 43 is a cross sectional view of the single-electron transistor 52 portion in the photodetector.

Figure 42:
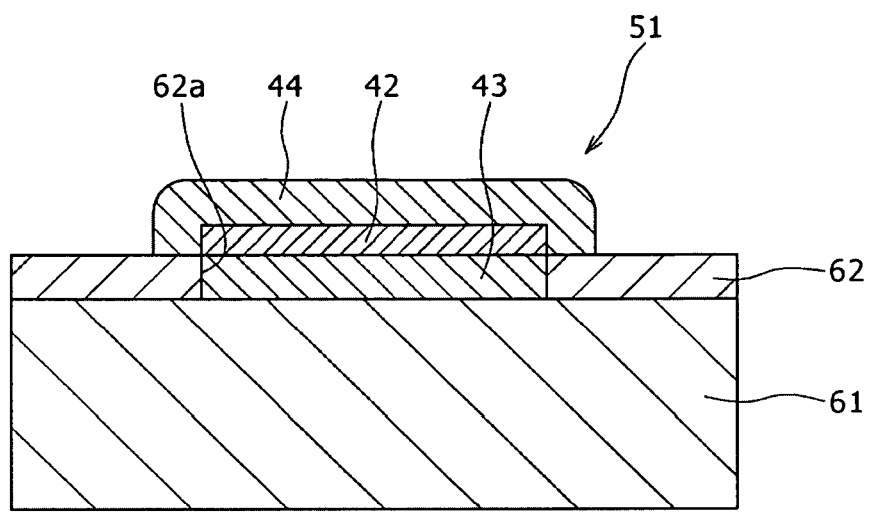
FIG. 42 is a cross sectional view showing a structural example of the photodetector according to the fifth embodiment.
Figure 43:
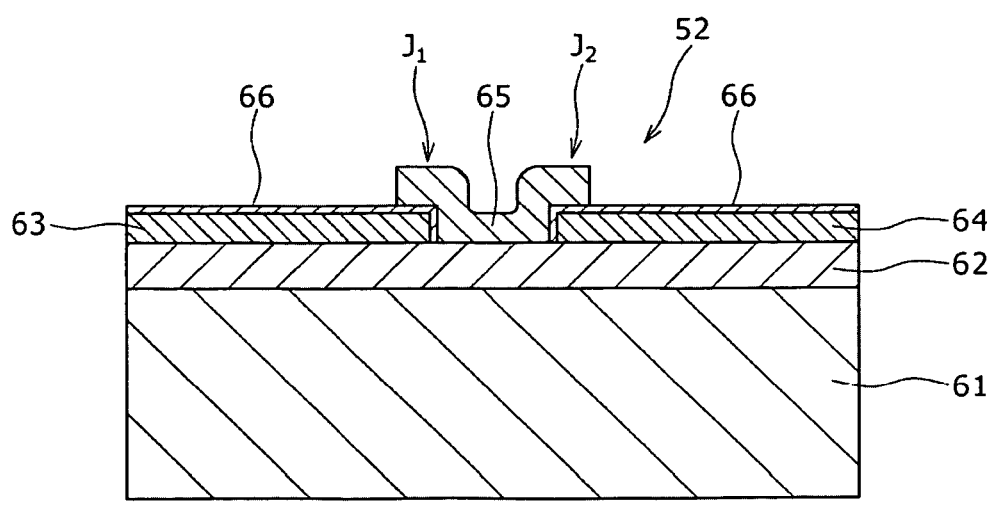
FIG. 43 is a cross sectional view showing another structural example of the photodetector according to the fifth embodiment.

As shown in FIGS. 41, 42 and 43, in the photodetector, an insulating film 62 such as an $SiO_2$ film, an SiN film or a polyimide film is formed on a substrate 61 such as a semiconductor substrate. An opening 62a is formed in the insulating film 62 in the photodiode 51 portion. Also, the electrode 43 is formed on the substrate 61 so as to be filled in the opening 62a. Also, a single-molecular layer made of zinc cytochrome c 42 is immobilized directly or indirectly on the electrode 43, and the electrode 44 is formed so as to cover the single-molecular layer made of zinc cytochrome c 42. In this case, the light permeates the electrode 44 to be received by the photodetector. Hence, the electrode 44 is structured to transmit the light which is used in the photoexcitation of the single-molecular layer made of zinc cytochrome c 42.

On the other hand, in the single-electron transistor 52 portion, a source electrode 63 and a drain electrode 64 are formed on the insulating film 62 so as to face each other. Also, a gate electrode 65 is formed so as to partially overlap opposite one ends of the source electrode 63 and the drain electrode 64. Here, an insulating film 66. for example, having a thickness of several hundreds of picometers to several nanometers is formed on at least surfaces of the opposite one ends of the source electrode 63 and the drain electrode 64 Which the gate electrode 65 overlaps. Therefore, the gate electrode 65 partially overlaps the opposite one ends of the source electrode 65 and the drain electrode 66 through the insulating film 66. An area of this overlapping portion is typically equal to or smaller than several hundreds of nanometers×several hundreds of nanometers. In this case, portions in which the gate electrode 65, and the source electrode 63 and the drain electrode 64 overlap each other through the insulating film 66 correspond to the minute tunnel junctions $J_1$ and $J_2$, respectively, shown in FIGS. 40 and 41. The gate electrode 65, the source electrode 63 and the drain electrode 64 are made of a metal such as Al, In, Nb, Au or Pt.

Although an illustration is omitted here, a passivation film is formed over the entire surface so as to cover the photodiode 51 and the single-electron transistor 52 as may be necessary.

In this case, one end portion of the electrode 44 of the photodiode 51 is close to the gate electrode 65 of the single-electron transistor 52. Also, when no passivation film is formed, a capacitor is formed to have a structure in which an air latter is held between the one end portion of the electrode 44 and the gate electrode 65. As a result, the electrode 44 of the photodiode 51 and the gate electrode 65 of the single-electron transistor 52 are capacitively-coupled to each other. On the other hand, when the passivation film is formed in the manner as described above, a capacitor is formed to have a structure in which the passivation film is held between the one end portion of the electrode 44 and the gate electrode 65. As a result, the electrode 44 and the gate electrode 65 are capacitively-coupled to each other.

As has been described, according to the fifth embodiment, the photodetector is structured such that the single-electron transistor 52 amplifies the output signal from the photodiode 51. Therefore, it is possible to promote the high-speed operation, the high sensitivity, and the low power consumption to a large extent as compared with the general photodetector in the related art structured such that the normal transition in the related art amplifies the output signal from the photodiode.

Next, a description will now be given with respect to a CCD image sensor according to a sixth embodiment of the present application. The CCD image sensor is one, utilizing an interline transfer system, which has a light receiving portion, a vertical register and a horizontal register.

Figure 44:
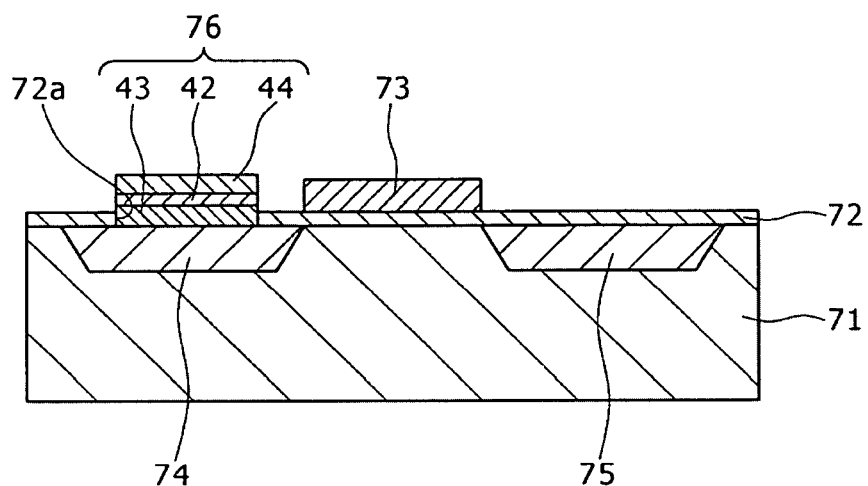
FIG. 44 is a cross sectional view showing a CCD image sensor according to a sixth embodiment.

FIG. 44 shows a cross-sectional structure of a light receiving portion, and a vertical register formed in the vicinity of the light receiving portion in the CCD image sensor of the sixth embodiment. As shown in FIG. 44, a gate insulating film 72 is formed on a p-type Si substrate 71 (or on a p-type well layer formed in an n-type Si substrate). Also, a readout gate electrode 73 is formed on the gate insulating film 72. An n-type layer 74, and an n-type layer 75 constituting the vertical register are formed in portions of the p-type Si substrate 71 corresponding to both sides of the readout gate electrode 73, respectively. An opening 72a is formed in the gate insulating film 72 so as to correspond in position to the n-type layer 74. Also, the photoelectric conversion element, for example, according to the fourth embodiment of the present application is formed as a light receiving portion 76 on a portion of the n-type layer 74 exposed through the opening 72a. The structure of the CCD image sensor other than the structure described above is the same as that of the CCD image sensor utilizing the interline transfer system known in the related art.

In the CCD image sensor, the electrode 43 is previously biased with a positive voltage with respect to the potential of the electrode 44 of the photoelectric conversion element. When a light is made incident to the single-molecular film or the multimolecular film made of zinc cytochrome c 42 in the light receiving portion 76, the electrodes generated by the photoexcitation are caused to flow into the n-type layer 74. Next, a positive voltage is applied to the readout gate electrode 73 in a state in which a higher voltage than that of the n-type layer 74 is applied to the n-type layer 75 constituting the vertical register, thereby forming an n-type channel in a portion of the p-type Si substrate 71 right under the readout gate electrode 73. Thus, the electrons accumulated in the n-type layer 74 are read out to the n-type layer 75 through the n-type channel. After that, the electrons thus read out are transferred to the vertical register, and are then transferred to the horizontal register. As a result, an electrical signal corresponding to an image captured with the CCD image sensor is taken out through output terminals.

According to the sixth embodiment, it is possible to realize the new CCD image sensor including the light receiving portion 76 having the single-molecular film or the multimolecular film made of zinc cytochrome c 42 used therein.

Next, a description will now be given with respect to an inverter circuit according to a seventh embodiment.

Figure 45:
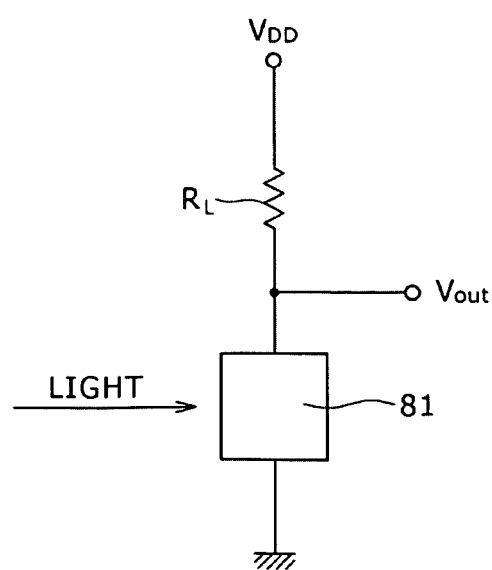
FIG. 45 is a circuit diagram showing an inverter circuit according to a seventh embodiment.

FIG. 45 shows the inverter circuit of the seventh embodiment. As shown in FIG. 45, in the inverter circuit, a photoelectric conversion element 81 having the same structure as that of the photoelectric conversion element of the fourth embodiment, and a load resistor $R_L$ are connected in series with each other. Here, the load resistor $R_L$ is connected to the electrode 43. A predetermined positive power source voltage $V_{DD}$ is applied to one end of the load resistor $R_L$, and the electrode 44 is grounded. When a visible light, for example, is radiated as a signal light to the single-molecular film or the multimolecular film made of zinc cytochrome c 42 of the photoelectric conversion element 81, the photoelectric conversion element 81 is turned ON to cause the photocurrent to flow. As a result, a level of an output voltage $V_{out}$ sent through the electrode 43 becomes a low level. When the radiation of the visible light is stopped, the photoelectric conversion element 81 is turned OFF to cause no photocurrent to flow. As a result, the level of the output voltage $V_{out}$ sent through the electrode 43 becomes a high level.

Figure 46:
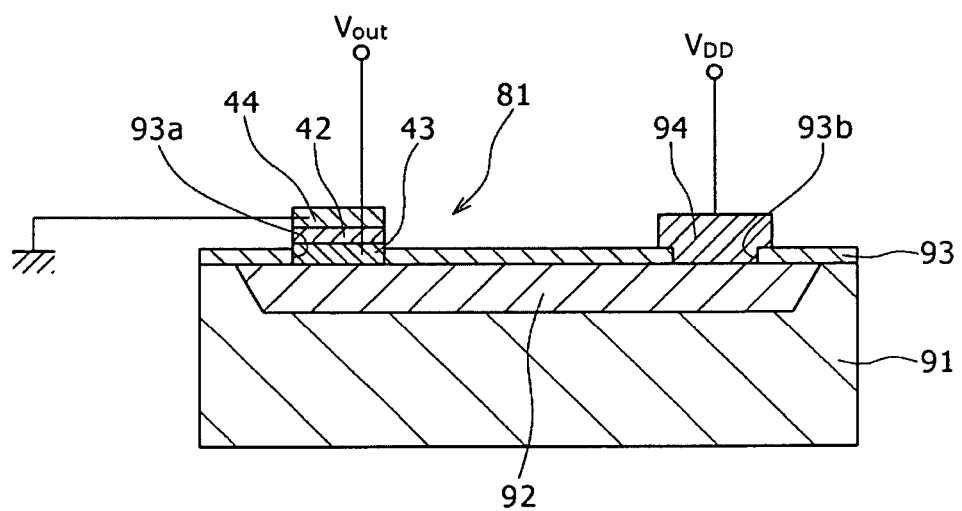
FIG. 46 is a circuit diagram partly in cross section, showing a structural example of the inverter circuit according to the seventh embodiment of the present application.

FIG. 46 shows an example of a structure of the inverter circuit of the seventh embodiment. As shown in FIG. 46, in this structural example, an n-type layer 92 used as the load resistor $R_L$ is formed in a p-type Si substrate 91 (or in a p-type well layer formed in an n-type Si substrate). An insulating film 93 such as an $SiO_2$ film is formed on a surface of the p-type Si substrate 91. Openings 93a and 93b are formed in the insulating film 93 so as to correspond in position to one end portion and the other end portion of the n-type layer 92, respectively. A photoelectric conversion element 81 is formed on a portion of the n-type layer 92 exposed through the opening 93a. An electrode 94 Ohmic-contacts to the n-type latter 92 through the opening 93b. In addition to the inverter circuit described above, various electronic circuits (such as an amplifier circuit) each of which is driven by using the output voltage Vout can be formed on the p-type Si substrate 91 as may be necessary.

According to the seventh embodiment, the inverter circuit can be configured by combining the photoelectric conversion element 81 using the single-molecular film or the multimolecular film made of zinc cytochrome c 42 and the load resistor $R_L$ with each other. As a result, various circuits such as a logic circuit can be configured by using the inverter circuit.

Although the present application has been described based on the embodiments, the present application is by no means limited to the embodiments described above, and various changes can be made based on the technical idea of the present application.

For example, the numerical values, the structures, the constitutions, the shapes, the materials and the like which are given in the embodiments described above are merely the examples. Thus, numerical values, structures, constitutions, shapes, materials and the like which are different from those, respectively, may be used as may be necessary.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A molecular device comprising:
   at least one molecule of zinc cytochrome c having at least a first amino acid residue and a second amino acid residue;
   wherein an electron or a hole is transferred within said at least one molecule of zinc cytochrome c by utilizing transition between the first amino acid residue and the second amino acid residue,
   wherein the at least one molecule of zinc cytochrome c is included in a film immobilized on a conductive electrode,
   wherein the first amino acid residue is located on a first side of the film in contact with the conductive electrode, and
   wherein the second amino acid residue is located on a second side of the film opposite to the conductive electrode.

2. The molecular device according to claim 1,
   wherein said molecular orbitals are a first molecular orbital which is localized in a first amino acid residue of the zinc cytochrome c, and a second molecular orbital which is localized in a second amino acid residue of the zinc cytochrome c and which has a maximum transition probability per unit time with respect to said first molecular orbital, and the electron or the hole is transferred between said first amino acid residue and said second amino acid residue.

3. The molecular device according to claim 2,
   wherein said first amino acid residue and said second amino acid residue constitute a start point and an end point of the transfer of the electron or the hole, respectively.

4. The molecular device according to claim 2,
   wherein an electron or a hole is generated in one of said first molecular orbital and said second molecular orbital by photoexcitation.

5. A functional device comprising:
   at least one molecule of zinc cytochrome c having at least a first amino acid residue and a second amino acid residue;
   wherein an electron or a hole is transferred within said at least one molecule of zinc cytochrome c by utilizing transition between the first amino acid residue and the second amino acid residue,
   wherein the at least one molecule of zinc cytochrome c is included in a film immobilized on a conductive electrode,
   wherein the first amino acid residue is located on a first side of the film in contact with the conductive electrode, and
   wherein the second amino acid residue is located on a second side of the film opposite to the conductive electrode.

6. A molecular wire comprising:
   at least one molecule of zinc cytochrome c having at least a first amino acid residue and a second amino acid residue;
   wherein an electron or a hole is transferred within said at least one molecule of zinc cytochrome c by utilizing transition between the first amino acid residue and the second amino acid residue,
   wherein the at least one molecule of zinc cytochrome c is included in a film immobilized on a conductive electrode,
   wherein the first amino acid residue is located on a first side of the film in contact with the conductive electrode, and
   wherein the second amino acid residue is located on a second side of the film opposite to the conductive electrode.

7. An electronic apparatus comprising;
   one or a plurality of functional devices;
   wherein said electronic apparatus uses a functional device, having at least one molecule of zinc cytochrome c having at least a first amino acid residue and a second amino acid residue, wherein an electron or a hole is transferred within said at least one molecule of zinc cytochrome c by utilizing transition between the first amino acid residue and the second amino acid residue, wherein the at least one molecule of zinc cytochrome c is included in a film immobilized on a conductive electrode, wherein the first amino acid residue is located on a first side of the film in contact with the conductive electrode, and wherein the second amino acid residue is located on a second side of the film opposite to the conductive electrode.

8. A molecular device comprising:

at least one molecule of electron transfer protein having at least a first amino acid residue and a second amino acid residue;

wherein an electron or a hole is transferred within said at least one molecule of electron transfer protein by utilizing transition between the first amino acid residue and the second amino acid residue, wherein the at least one molecule of electron transfer protein is included in a film immobilized on a conductive electrode, wherein the first amino acid residue is located on a first side of the film in contact with the conductive electrode, and wherein the second amino acid residue is located on a second side of the film opposite to the conductive electrode.

9. A functional device comprising:

at least one molecule of electron transfer protein having at least a first amino acid residue and a second amino acid residue;

wherein an electron or a hole is transferred within said at least one molecule of electron transfer protein by utilizing transition between the first amino acid residue and the second amino acid residue, wherein the at least one molecule of electron transfer protein is included in a film immobilized on a conductive electrode, wherein the first amino acid residue is located on a first side of the film in contact with the conductive electrode, and wherein the second amino acid residue is located on a second side of the film opposite to the conductive electrode.

10. A molecular wire comprising:

at least one molecule of electron transfer protein having at least a first amino acid residue and a second amino acid residue;

wherein an electron or a hole is transferred within said at least one molecule of electron transfer protein by utilizing transition between the first amino acid residue and the second amino acid residue, wherein the at least one molecule of electron transfer protein is included in a film immobilized on a conductive electrode, wherein the first amino acid residue is located on a first side of the film in contact with the conductive electrode, and wherein the second amino acid residue is located on a second side of the film opposite to the conductive electrode.

11. An electronic apparatus comprising;

one or a plurality of functional devices;

wherein said electronic apparatus uses a functional device, having at least one molecule of electron transfer protein having at least a first amino acid residue and a second amino acid residue, wherein an electron or a hole is transferred within said at least one molecule of electron transfer protein by utilizing transition between the first amino acid residue and the second amino acid residue, wherein the at least one molecule of electron transfer protein is included in a film immobilized on a conductive electrode, wherein the first amino acid residue is located on a first side of the film in contact with the conductive electrode, and wherein the second amino acid residue is located on a second side of the film opposite to the conductive electrode.

12. The molecular device according to claim 1, wherein the first and second amino acid residues between which the electron or the hole is transferred are coupled to each other.

13. The molecular device according to claim 1, wherein the at least one molecule of zinc cytochrome c includes a hybridized molecular orbital comprising zinc porphyrin having an axial ligand.

* * * * *